(12) United States Patent
Jo et al.

(10) Patent No.: US 11,776,972 B2
(45) Date of Patent: Oct. 3, 2023

(54) METHOD AND APPARATUS FOR MANUFACTURING MASK ASSEMBLY AND METHOD OF MANUFACTURING DISPLAY DEVICE

(71) Applicant: Samsung Display Co., Ltd., Yongin-si (KR)

(72) Inventors: Junho Jo, Yongin-si (KR); Seungwon Kim, Yongin-si (KR); Youngho Park, Yongin-si (KR); Youngchul Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 343 days.

(21) Appl. No.: 17/097,388

(22) Filed: Nov. 13, 2020

(65) Prior Publication Data

US 2021/0343760 A1 Nov. 4, 2021

(30) Foreign Application Priority Data

May 4, 2020 (KR) ........................ 10-2020-0053387

(51) Int. Cl.
*H01L 27/12* (2006.01)
*C23C 14/54* (2006.01)
*C23C 14/04* (2006.01)

(52) U.S. Cl.
CPC ........ *H01L 27/1288* (2013.01); *C23C 14/042* (2013.01); *C23C 14/54* (2013.01); *H01L 27/1285* (2013.01)

(58) Field of Classification Search
CPC ....... C23C 14/042; C23C 14/04; C23C 14/24; C23C 14/54; H01L 51/0011; H01L 51/56; H01L 27/1285; H01L 27/1288
See application file for complete search history.

(56) References Cited

U.S. PATENT DOCUMENTS 10,675,711 B2 6/2020 Han
2011/0185561 A1* 8/2011 Landgraf .................. G03F 7/12
29/446

(Continued)

FOREIGN PATENT DOCUMENTS

KR 10-1992-0007420 8/1992
KR 10-0647576 11/2006

(Continued)

*Primary Examiner* — Jaehwan Oh
(74) *Attorney, Agent, or Firm* — Lewis Roca Rothgerber Christie LLP

(57) ABSTRACT

An apparatus and a method for manufacturing a mask assembly and a method of manufacturing a display device are provided. The apparatus may include: a tensioning part configured to be spaced apart from a mask frame comprising at least one opening, the tensioning part configured to tension a mask sheet in at least one of a first direction and a second direction, the mask sheet comprising a cell area corresponding to the at least one opening, and a dummy portion arranged outside the cell area; a pressing part configured to correspond to the dummy portion and press the dummy portion in a third direction intersecting a plane in which the first direction and the second direction extend; and a header configured to irradiate a laser beam toward the mask sheet to fix the mask sheet to the mask frame.

19 Claims, 18 Drawing Sheets

(56) References Cited

U.S. PATENT DOCUMENTS

| | | | | |
|---|---|---|---|---|
| 2013/0318774 | A1* | 12/2013 | Kang | B05C 21/005 |
| | | | | 254/133 R |
| 2016/0228910 | A1* | 8/2016 | Kang | C23C 14/042 |
| 2017/0001259 | A1* | 1/2017 | Han | B23K 26/14 |
| 2017/0369982 | A1* | 12/2017 | Ma | H10K 71/00 |
| 2019/0006593 | A1* | 1/2019 | Wu | C23C 14/042 |
| 2022/0081754 | A1* | 3/2022 | Qi | B23K 20/10 |

FOREIGN PATENT DOCUMENTS

| | | |
|---|---|---|
| KR | 10-2017-0045429 | 4/2017 |
| KR | 10-2020-0009616 | 1/2020 |
| KR | 10-2020-0009617 | 1/2020 |

\* cited by examiner

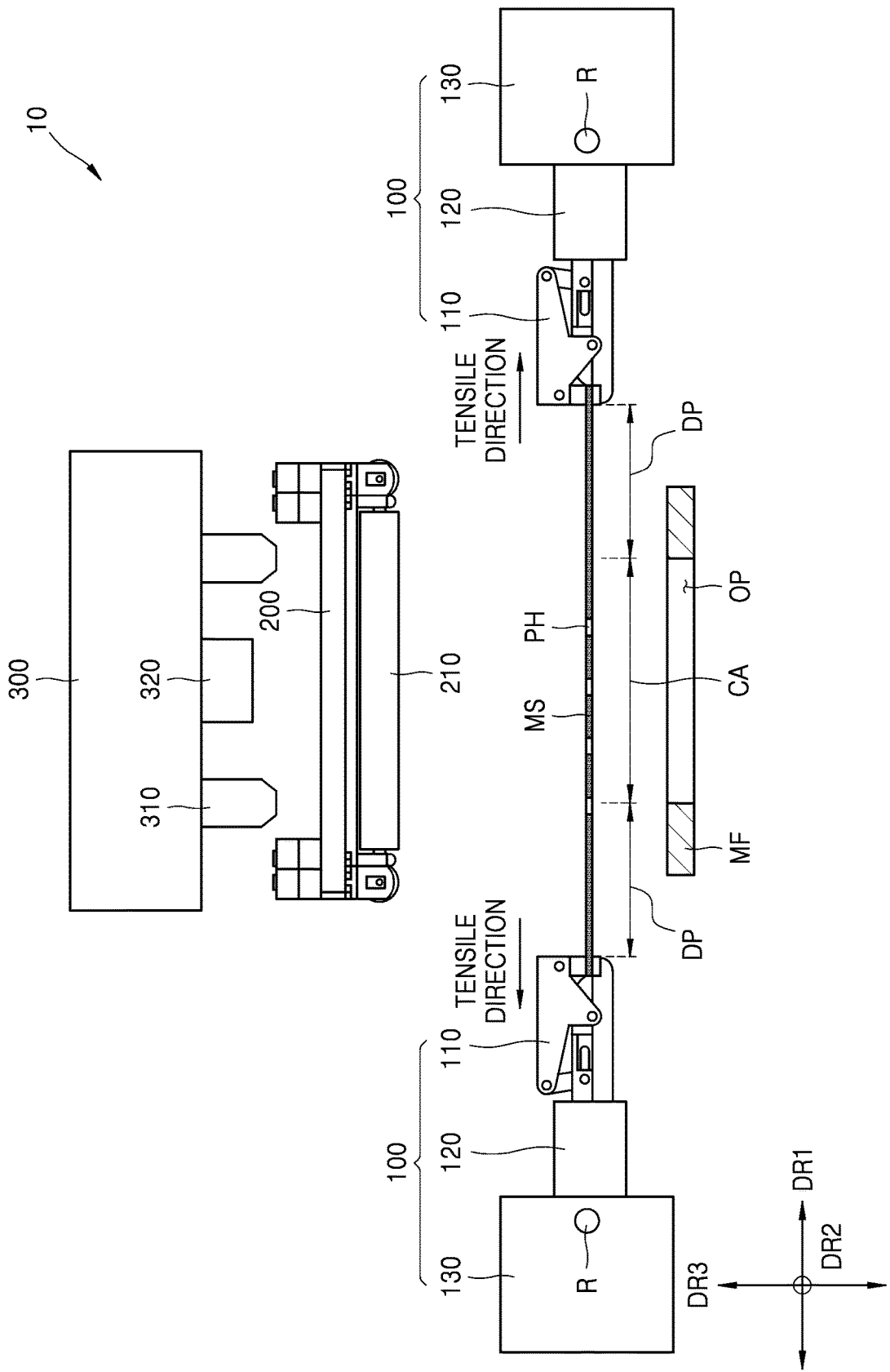

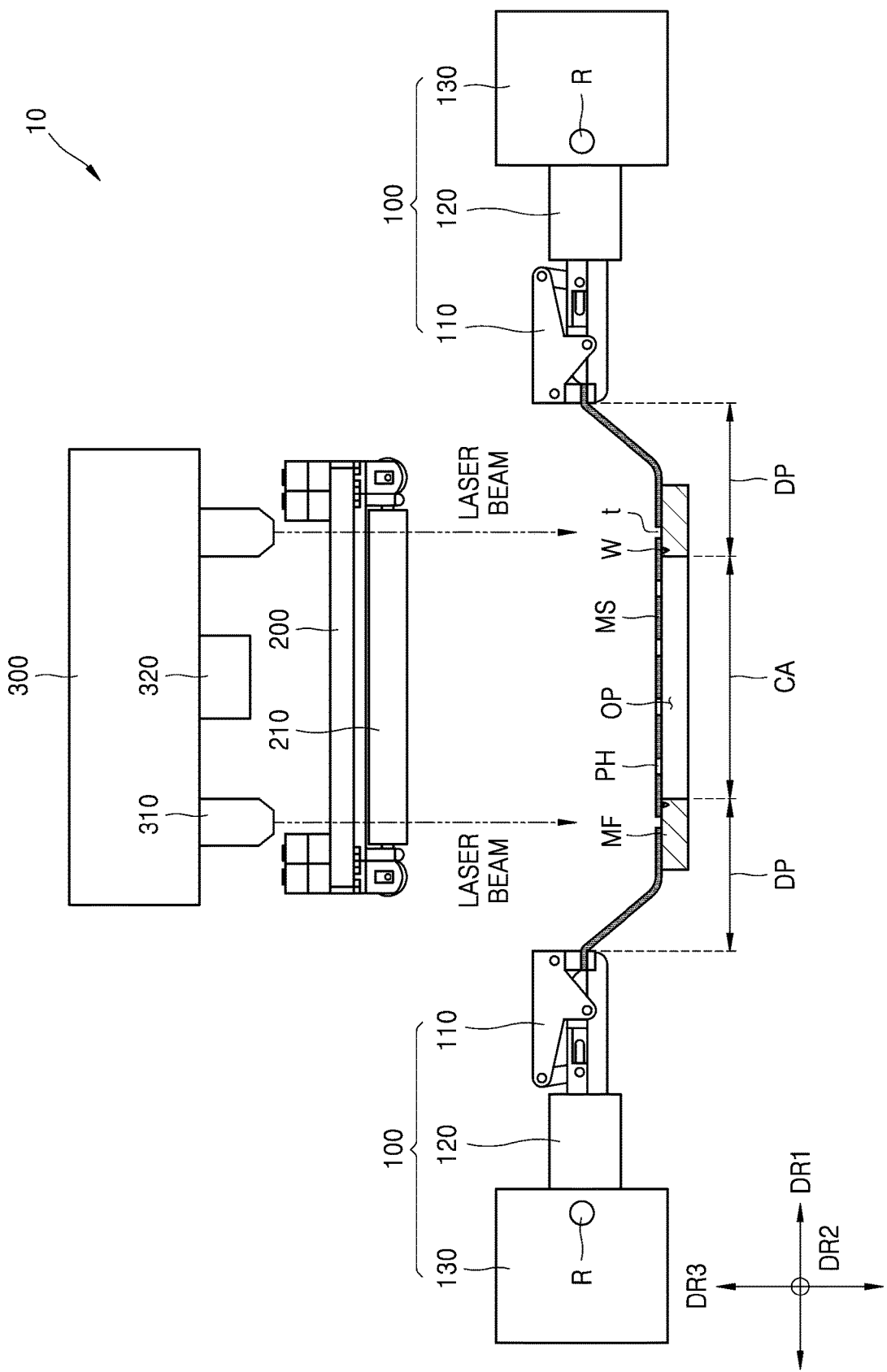

METHOD AND APPARATUS FOR MANUFACTURING MASK ASSEMBLY AND METHOD OF MANUFACTURING DISPLAY DEVICE

CROSS-REFERENCE TO RELATED APPLICATION

This application claims priority to and the benefit of Korean Patent Application No. 10-2020-0053387, filed on May 4, 2020 in the Korean Intellectual Property Office, the entire disclosure of which is incorporated herein by reference.

BACKGROUND

1. Field

Aspects of embodiments of the present disclosure relate to an apparatus for manufacturing a mask assembly, a method of manufacturing a mask assembly, and a method of manufacturing a display device.

2. Description of Related Art

Mobile electronic devices are widely used. As mobile electronic devices, tablet personal computers (PCs) have been widely used in recent years in addition to small electronic devices, such as mobile phones.

A mobile electronic device includes a display device to provide visual information, such as an image or video, to a user in order to support various functions. Recently, as other components for driving a display device have been miniaturized, the display device in an electronic device has become increasingly significant, and a structure that may be bent to have a certain angle in a flat state has also been developed.

On the other hand, in the process of manufacturing a display device, a method of depositing an organic material or the like at a desired position by adhering a thin-film metal mask to a substrate may be used, and the higher the image quality of a display device to be manufactured, the higher the alignment precision of a mask is required.

SUMMARY

According to an aspect of one or more embodiments of the present disclosure, an apparatus for manufacturing a mask assembly, in which deformation of a mask sheet is reduced and alignment accuracy is improved, a method of manufacturing the mask assembly, and a method of manufacturing a display device are provided. However, this aspect is merely an example and the scope of the disclosure is not limited thereby.

Additional aspects will be set forth, in part, in the description which follows and, in part, will be apparent from the description, or may be learned by practice of the presented embodiments of the disclosure.

According to one or more embodiments, an apparatus for manufacturing a mask assembly includes: a tensioning part configured to be spaced apart from a mask frame comprising at least one opening, the tensioning part configured to tension a mask sheet in at least one of a first direction and a second direction, the mask sheet comprising a cell area corresponding to the at least one opening, and a dummy portion arranged outside the cell area; a pressing part configured to correspond to the dummy portion and press the dummy portion in a third direction intersecting a plane in which the first direction and the second direction extend; and a header configured to irradiate a laser beam toward the mask sheet to fix the mask sheet to the mask frame.

The tensioning part may include at least one pair of grip parts configured to grip an edge of the dummy portion, and a moving part that moves the at least one pair of grip parts in the first direction or the second direction to apply a tensile force to the mask sheet.

The tensioning part may further include a rotator that rotates the grip part around a rotation axis parallel to a surface of the mask frame.

The header may be configured to check alignment between the mask sheet and the mask frame.

The header may be configured to irradiate a laser beam to the mask sheet to cut a portion of the dummy portion from the cell area of the mask sheet.

The pressing part may include at least two rollers to be placed in direct contact with the dummy portion.

The at least two rollers may be arranged at opposite sides of an area corresponding to the cell area to sandwich the area between the at least two rollers.

The pressing part may include an injection hole configured to spray compressed air to the dummy portion in the third direction.

The pressing part may include a plurality of magnets arranged to apply a magnetic force in the third direction to the dummy portion.

The pressing part may be configured to bend the mask sheet such that the cell area is closer to the mask frame than an edge of the dummy portion.

The pressing part may be configured to bend a portion of the mask sheet to be rounded.

According to one or more embodiments, a method of manufacturing a mask assembly includes preparing a mask frame including at least one opening, preparing a mask sheet including a cell area corresponding to the opening and a dummy portion arranged outside the cell area, tensioning the mask sheet, aligning the mask sheet to a side of the mask frame, pressing the dummy portion of the mask sheet toward the mask frame, and fixing the mask sheet to the mask frame by irradiating a laser beam to the dummy portion.

The method may further include forming at least two pattern holes in the cell area of the mask sheet.

The tensioning the mask sheet may include gripping an edge of the dummy portion and applying a tensile force to the mask sheet in a first direction or a second direction.

The pressing the dummy portion may include pressing the mask sheet toward the mask frame by applying a force directly to the dummy portion, bending a portion of the dummy portion, and bringing the dummy portion into contact with the mask frame.

The pressing the dummy portion may include pressing the dummy portion toward the mask frame by spraying compressed air to the dummy portion, bending a portion of the dummy portion, and bringing the dummy portion into contact with the mask frame.

The pressing the dummy portion may include pressing the dummy portion toward the mask frame by applying a magnetic force to the dummy portion, bending a portion of the dummy portion, and bringing the dummy portion into contact with the mask frame.

The method may further include bending at least a portion of the dummy portion to be rounded.

The method may further include cutting a portion of the dummy portion from the cell area of the mask sheet by irradiating a laser beam to the portion of the dummy portion.

According to one or more embodiments, a method of manufacturing a display device includes preparing a mask assembly, placing and aligning a substrate and the mask assembly inside a chamber, and supplying a deposition material from a deposition source to the substrate through the mask assembly, wherein the preparing the mask assembly includes tensioning a mask sheet including a cell area and a dummy portion arranged outside the cell area, aligning the mask sheet above a mask frame including at least one opening, pressing the dummy portion of the mask sheet toward the mask frame, and fixing the mask sheet to the mask frame by irradiating a laser beam to the dummy portion.

These and/or other aspects will become apparent and more readily appreciated from the following description of some embodiments, the accompanying drawings, and the claims.

These and/or other aspects may be implemented by using a system, a method, a computer program, or a combination of a certain system, method, and computer program.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 7A to 7F are schematic cross-sectional views illustrating a process of manufacturing a mask assembly, according to an embodiment;

DETAILED DESCRIPTION

Figure 1:
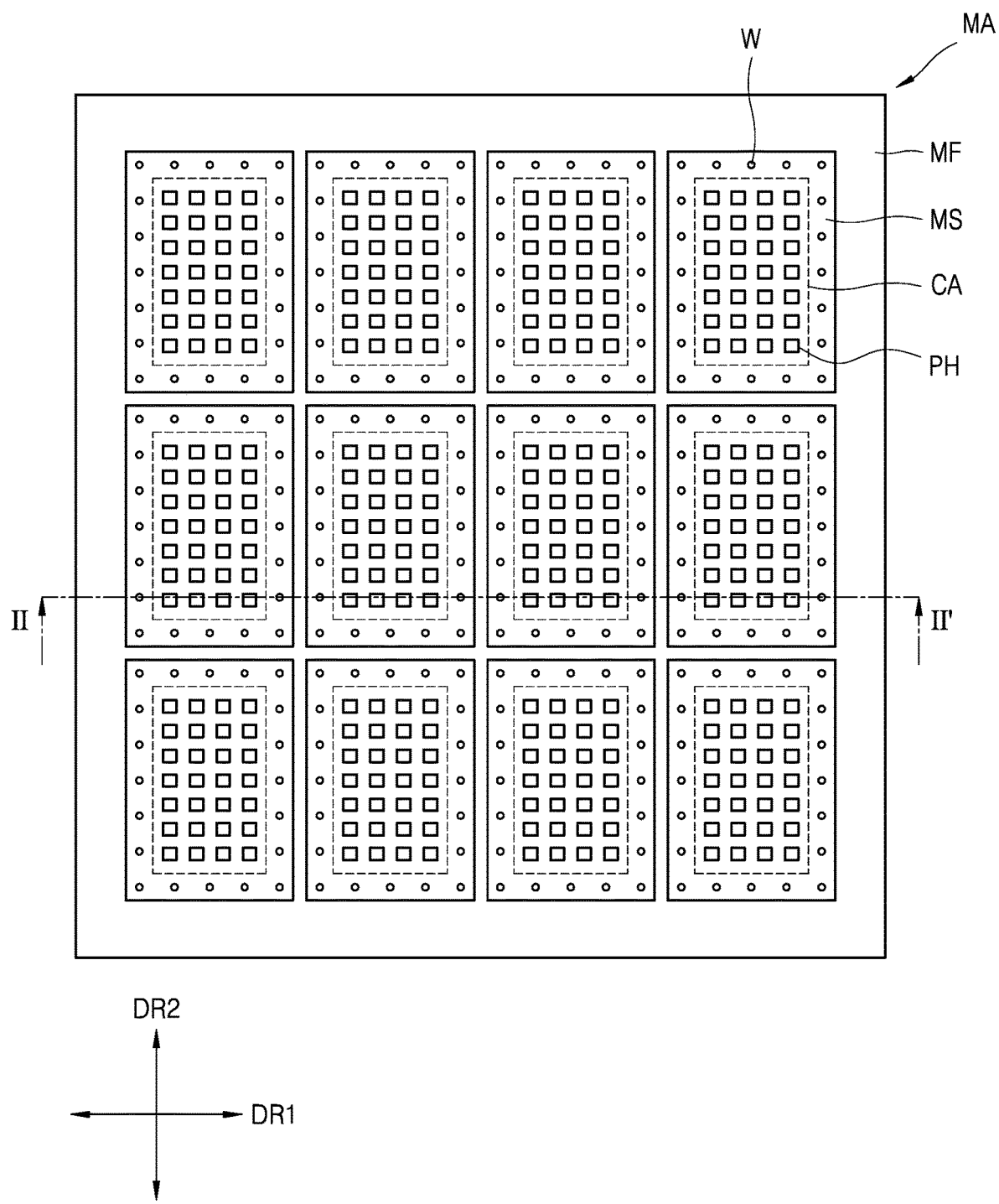
FIG. 1 is a schematic plan view illustrating a mask assembly, according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

The example embodiments will be described below in further detail with reference to the accompanying drawings. Those components that are the same or are in correspondence are rendered the same reference symbol regardless of the figure number, and redundant explanations may be omitted.

While such terms as "first," "second," etc., may be used to describe various components, such components are not to be limited by the above terms. The above terms are used to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It is to be understood that when a layer, region, or component is referred to as being "formed on" another layer, region, or component, it may be directly or indirectly formed on the other layer, region, or component. That is, for example, one or more intervening layers, regions, or components may be present.

Sizes of components in the drawings may be exaggerated for convenience of explanation. In other words, because sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the embodiments below, when layers, areas, or elements or the like are referred to as being "connected," it is to be understood that they may be directly connected or one or more intervening portions may be present between layers, areas, or elements. For example, when layers, areas, or elements or the like are referred to as being "electrically connected," they may be directly electrically connected, or layers, areas, or elements may be indirectly electrically connected and one or more intervening portions may be present.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

Figure 2:
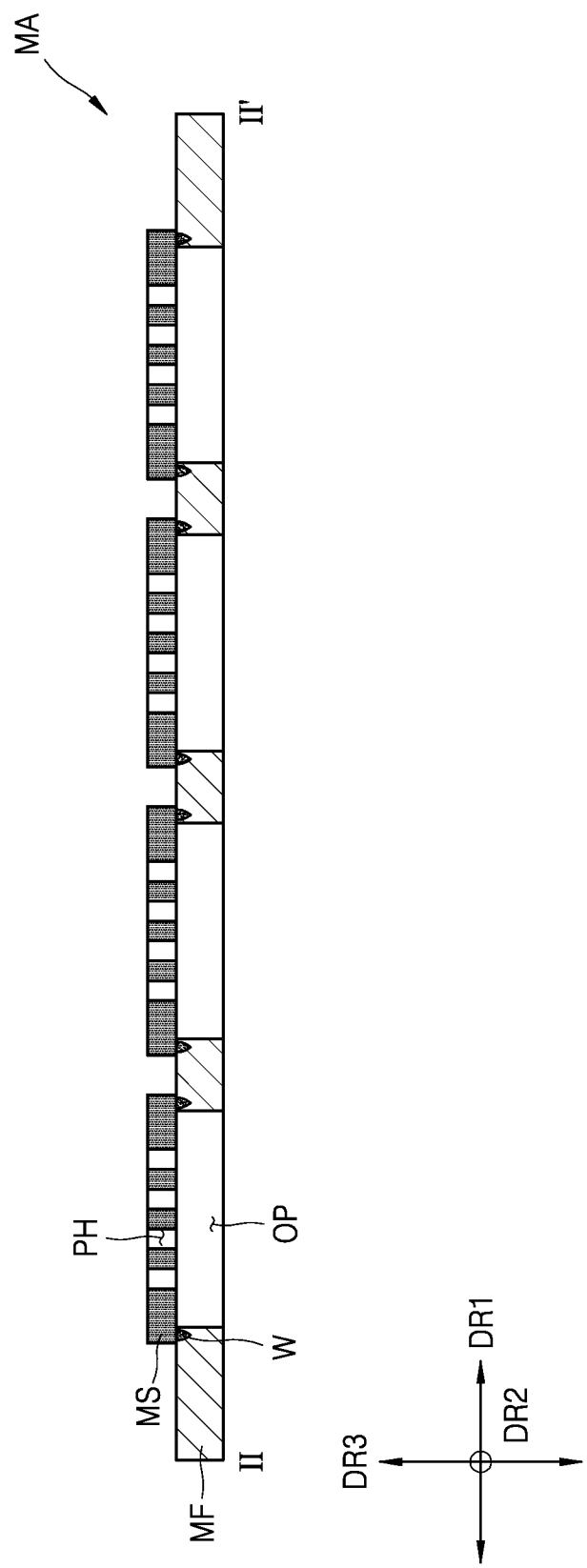
FIG. 2 is a schematic cross-sectional view illustrating the mask assembly of FIG. 1.

FIG. 1 is a schematic plan view illustrating a mask assembly MA according to an embodiment; and FIG. 2 is a schematic cross-sectional view illustrating the mask assembly MA of FIG. 1. FIG. 2 may correspond to a cross-section of the mask assembly MA taken along the line II-II' of FIG. 1.

Referring to FIGS. 1 and 2, the mask assembly MA may include a mask frame MF and a mask sheet MS. For example, the mask assembly MA may include one mask frame MF and at least one mask sheet MS. Although the mask assembly MA in FIG. 1 is shown provided with a total of twelve mask sheets MS, the present disclosure is not limited thereto, and a user may design the mask assembly MA differently according to the sizes of the mask frame MF and the mask sheet MS.

The mask frame MF may have a quadrangular shape on a plane, but is not limited thereto. For example, the mask frame MF may have any of various shapes, such as a polygon, such as a triangle or a pentagon, a circle, and an oval. However, herein, for convenience of description, a case in which the mask frame MF has a rectangular shape will be described.

The mask frame MF may have a very small thickness compared to a horizontal or vertical length thereof. When the thickness of the mask frame MF is too large, a deposition material may be restricted from passing through the mask sheet MS in a deposition process using the mask assembly MA. Conversely, when the thickness of the mask frame MF is too small, it may be difficult to secure rigidity for supporting the mask sheet MS. Therefore, the mask frame MF may have an appropriate thickness considering the above points.

In an embodiment, the mask frame MF may include a material such as Invar, nickel, or nickel-cobalt. Because these materials have a low coefficient of thermal expansion, it is possible to reduce deformation of the mask frame MF due to heat during a process of manufacturing the mask assembly MA.

Figure 4:
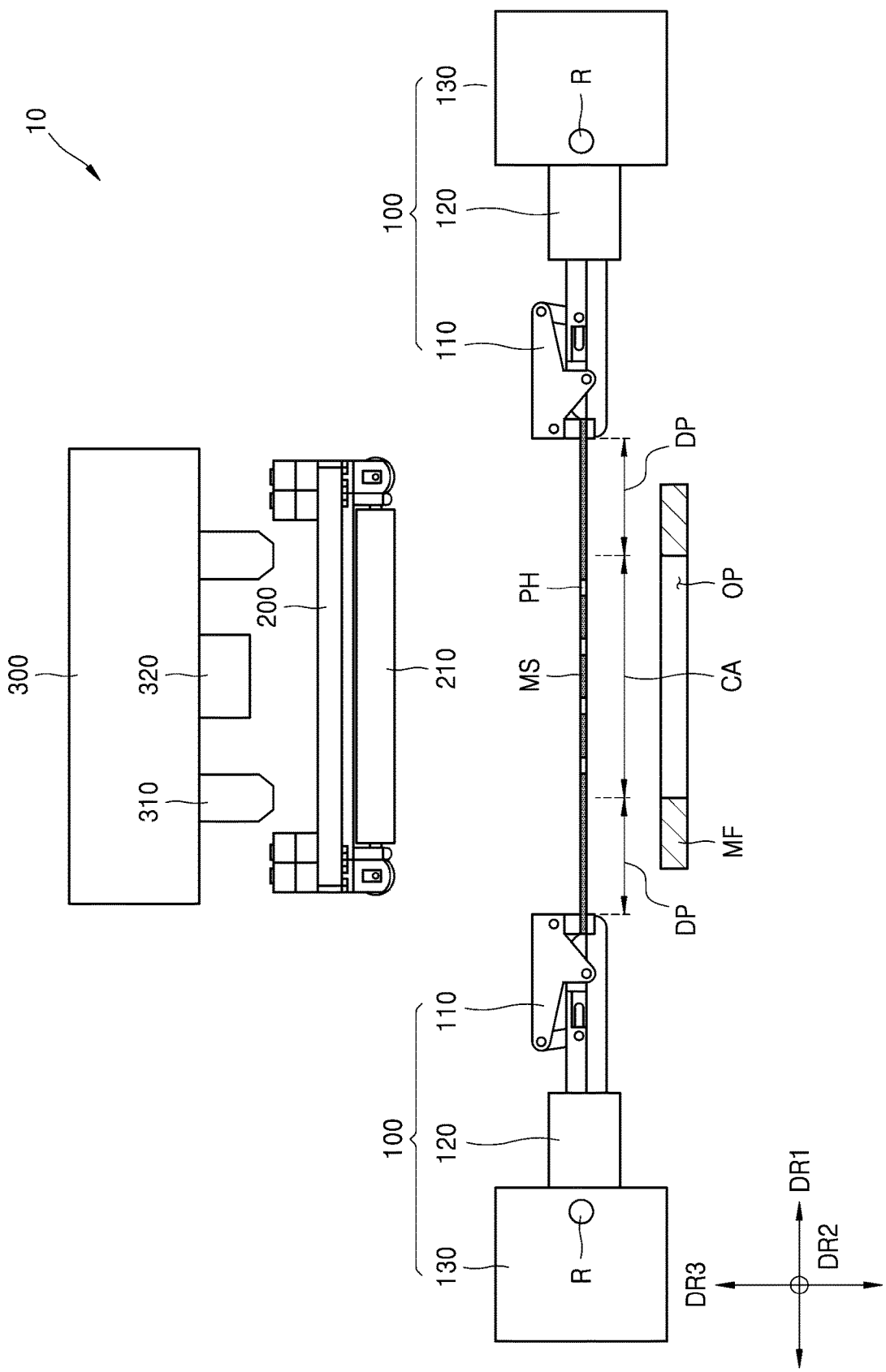
FIG. 4 is a schematic cross-sectional view illustrating an apparatus for manufacturing a mask assembly, according to an embodiment.

The mask frame MF may include at least one opening OP. Because the mask sheet MS is fixed to a side of the mask frame MF, the opening OP located in the mask frame MF is not shown in FIG. 1. However, the opening OP is shown in FIGS. 2 and 4. The opening OP may have, for example, a shape of a quadrangle on a plane, or may have any of various shapes, such as a polygon, such as a triangle or a pentagon, a circle, and an oval. However, herein, for convenience of description, a case in which the opening OP has a quadrangular shape will be described.

When a plurality of openings OP are formed in the mask frame MF, the mask frame MF may have a lattice structure, such as a window frame or a mesh. In an embodiment, the openings OP may have the same area. In an embodiment, the openings OP may be arranged at equal intervals.

A cross-section taken along a thickness direction of the mask frame MF may have a quadrangular shape, such as a rectangle, a rhombus, or a parallelogram, and the corners of the quadrangular shape may be round.

The mask frame MF may support the mask sheet MS, which will be described below.

The mask sheet MS may have a quadrangular shape on a plane, but is not limited thereto. For example, the mask sheet MS may have any of various shapes, such as a polygon, such as a triangle or a pentagon, a circle, and an oval. However, herein, for convenience of description, a case in which the mask sheet MS has a quadrangular shape will be described.

In an embodiment, one mask sheet MS may be arranged in one opening OP of the mask frame MF. In this case, the mask sheet MS may shield the opening OP of the mask frame MF. The mask sheet MS in a tensioned state may be fixed to the mask frame MF. For example, the mask sheet MS may be fixed to the mask frame MF by welding. In this case, welding may be performed along an edge of the mask sheet MS, and, thus, the mask sheet MS may be fixed to the mask frame MF by welding points W.

In one mask sheet MS, one cell area CA corresponding to one opening OP of the mask frame MF may be provided. One cell area CA may correspond to one display device. At least one pattern hole PH may be formed in the cell area CA. The pattern hole PH may be a hole penetrating in a thickness direction of the mask sheet MS such that a deposition material may pass therethrough. That is, the deposition material may be deposited on an object (e.g., a substrate, etc.) through the opening OP of the mask frame MF and the pattern hole PH of the mask sheet MS.

In an embodiment, the pattern hole PH may have a rectangular or square shape on a plane, but may have any of various shapes, such as a circle, an oval, and a polygon, such as a triangle. In an embodiment, when a plurality of pattern holes PH are provided, the areas of the pattern holes PH on a plane may be the same.

In an embodiment, the mask sheet MS may include a material such as Invar, nickel, and nickel-cobalt having a thermal expansion coefficient that is the same as or similar to that of the mask frame MF.

As a comparative example, the mask sheet MS may be of a stick type or a plate type, and a plurality of cell areas may be provided on one stick or plate. In this case, as the size of a display device to be manufactured increases, one cell area of a mask sheet corresponding to the display device may also increase. As the size of one cell area increases, a mask sheet including a plurality of cell areas may become very large. Because the mask sheet has a very small thickness, the larger the size of the mask sheet, the more easily it may be warped or sagged by a load. In order to reduce this phenomenon, the mask sheet may be tensioned and fixed to a mask frame. However, in this case, as the size of the mask sheet increases, a larger tensile force is required and it may be difficult to secure precision due to sagging and warping. In addition, because the plurality of cell areas are present in one mask sheet, it may take considerable processing time to measure the degree of alignment of all the cell areas and perform tensioning and alignment of the mask sheet. In addition, when a defect occurs in one cell area, there may be a problem of repairing or discarding the entire mask sheet.

However, in the case of the mask sheet MS according to one or more embodiments of the present disclosure, because one cell area CA is provided in one mask sheet MS, the horizontal or vertical length of one mask sheet MS may be relatively short. That is, it is possible to reduce the size and weight of the mask sheet MS. In an embodiment, one cell area CA may correspond to one opening OP of the mask frame MF, and may be supported by the mask frame MF.

Therefore, sagging and warping due to the load of the mask sheet MS may be reduced. In addition, a tensile force for tensioning one mask sheet MS may also be relatively small. Through this, the degree of deformation of the mask sheet MS may be reduced, and a pixel position accuracy (PPA) of the pattern hole PH of the mask sheet MS may be improved.

In addition, because a processing time required to perform tensioning and alignment of one mask sheet MS is significantly reduced, even if a mask assembly MA including the same cell area CA is manufactured, the processing time may be less than that of the comparative example. Through this, the manufacturing yield of the mask assembly MA may be improved.

In addition, even if a defect occurs in the pattern hole PH formed in one cell area CA, only one mask sheet MS needs to be repaired or discarded, and, thus, the process of manufacturing the mask assembly MA may be efficient.

Figure 3:
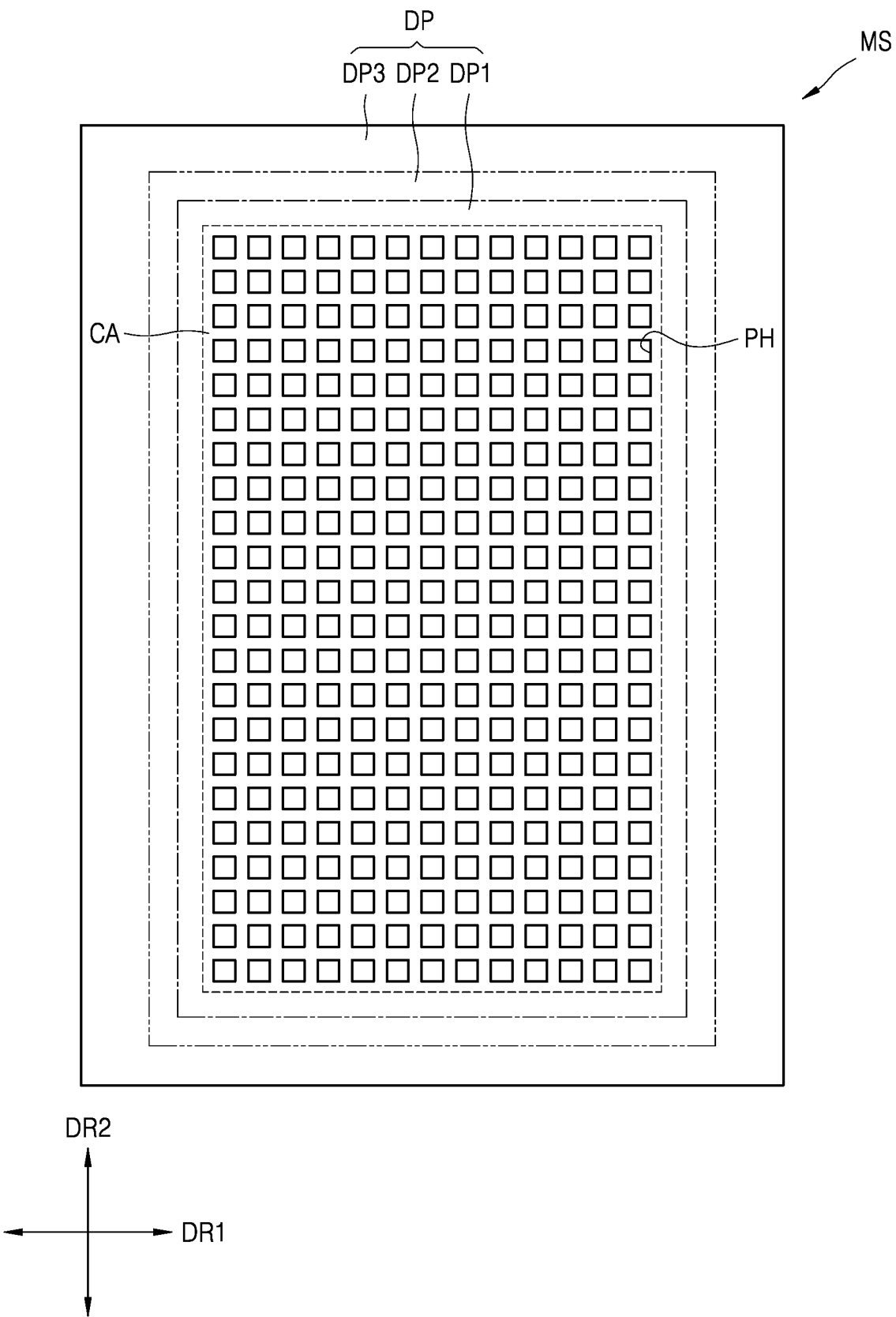
FIG. 3 is a schematic plan view illustrating a mask sheet, according to an embodiment.

FIG. 3 is a schematic plan view illustrating the mask sheet MS, according to an embodiment.

Referring to FIG. 3, the mask sheet MS may include a cell area CA and pattern holes PH arranged in the cell area CA, as described above. Also, the mask sheet MS may include a dummy portion DP arranged outside the cell area CA. The dummy portion DP may be defined as an area other than the cell area CA in the mask sheet MS.

The dummy portion DP may include a fixed area DP1 adjacent to the cell area CA outside the cell area CA, a gripping area DP3 located at an outermost side along the edge of the mask sheet MS, and a pressing area DP2 between the fixed area DP1 and the gripping area DP3.

The gripping area DP3 may be an area in which the mask sheet MS is gripped by a tensioning part 100 (see FIG. 4), as described below with reference to FIG. 4. Therefore, the gripping area DP3 is located at the outermost side of the mask sheet MS in order to be gripped by the tensioning part 100, and a sufficient area may be provided for the gripping area DP3. For example, the gripping area DP3 may be arranged along two edges located opposite to each other with the cell area CA therebetween. As an example, the gripping area DP3 may be arranged along four edges of the mask sheet MS.

The pressing area DP2 may be arranged inside the gripping area DP3. As described below with reference to FIG. 4, the pressing area DP2 may be an area that receives a force in a direction toward the mask frame MF by a pressing part 200 (see FIG. 4). Therefore, bending of the mask sheet MS may be substantially made in the pressing area DP2.

The fixed area DP1 may be an area used to fix the mask sheet MS to the mask frame MF. For example, welding for fixing the mask sheet MS to the mask frame MF may be performed in the fixed area DP1, and, thus, welding points may be arranged in the fixed area DP1. When the mask sheet MS is fixed to the mask frame MF, the fixed area DP1 may be located adjacent to the cell area CA of the mask sheet MS to prevent or substantially prevent the mask sheet MS from warping or bending.

FIG. 4 is a schematic cross-sectional view illustrating an apparatus 10 for manufacturing a mask assembly (herein, referred to as the mask assembly manufacturing apparatus), according to an embodiment.

Referring to FIG. 4, the mask assembly manufacturing apparatus 10 may include a tensioning part 100, a pressing part 200, and a header 300.

The tensioning part 100 may be spaced apart from a mask frame MF. For example, the tensioning part 100 may be arranged above the mask frame MF. In this case, the mask sheet MS may be supported at the upper side of the mask frame MF. As another example, the tensioning part 100 may be arranged under the mask frame MF. In this case, the mask sheet MS may be supported at the lower side of the mask frame MF. Herein, for convenience of description, a case in which the tensioning part 100 is arranged above the mask frame MF will be described.

The tensioning part 100 may tension the mask sheet MS in at least one of a first direction DR1 and a second direction DR2. The first direction DR1 and the second direction DR2 may intersect with each other. For example, the angle at which the first direction DR1 and the second direction DR2 intersect with each other may be a right angle or an acute angle. For example, when the mask sheet MS is to be tensioned in directions respectively perpendicular to four edges of the mask sheet MS having a rectangular shape on a plane, the first direction DR1 and the second direction DR2 may form a right angle. As another example, when the mask sheet MS is to be tensioned in directions from the center of the mask sheet MS toward four vertices of the mask sheet MS, the angle at which the first direction DR1 and the second direction DR2 intersect with each other may be an acute angle. Herein, for convenience of description, a case in which the first direction DR1 and the second direction DR2 form a right angle and the mask sheet MS is tensioned in the directions respectively perpendicular to the four edges of the mask sheet MS will be described.

The tensioning part 100 may include a grip part 110 that grips the mask sheet MS. As an example, the tensioning part 100 may include at least one pair of grip parts 110 gripping both of opposite edges of the dummy portion DP of the mask sheet MS. The mask sheet MS may be located between the pair of grip parts 110.

Also, the tensioning part 100 may include a moving part 120 that moves the grip part 110 in the first direction DR1 or the second direction DR2. The moving part 120 may apply a tensile force to the mask sheet MS by moving the grip parts 110 gripping the mask sheet MS in directions away from each other, and, thus, the mask sheet MS may be tensioned in the first direction DR1 and/or the second direction DR2. The moving part 120 may include a linear driver (not shown), such as a pneumatic cylinder, a hydraulic cylinder, a linear motor, or a motor having a rack and pinion.

In an embodiment, the tensioning part 100 may include a rotator 130 that rotates the grip part 110 around a rotation axis R parallel to a surface of the mask frame MF. The rotator 130 may include a rotating driver (not shown), such as a servo motor, a pneumatic motor, a rotating cylinder, a motor having a v-belt, or the like.

The pressing part 200 may be spaced apart from the mask frame MF. For example, the pressing part 200 may be arranged above and spaced apart from the mask frame MF. The pressing part 200 may move in a third direction DR3 intersecting with a plane in which the first direction DR1 and the second direction DR2, in which the mask sheet MS is tensioned, extend, and may apply a force in the third direction DR3 to the mask sheet MS. For example, the pressing part 200 may be arranged above the mask frame MF and the mask sheet MS, and may move up and down in a direction perpendicular to a plane on which the mask sheet MS is placed. The pressing part 200 may apply a force downward toward the mask sheet MS.

When the pressing part 200 moves in the third direction DR3, the pressing part 200 may pass between a pair of tensioning parts 100 facing each other. To this end, a length of the pressing part 200 in the first direction DR1 or the second direction DR2 may be less than a distance between the pair of tensioning parts 100 facing each other.

In an embodiment, the pressing part 200 may include at least two rollers 210 to be placed in direct contact with the mask sheet MS. The shape of the pressing part 200 will be described in further detail with reference to FIG. 5 below.

The header 300 may be arranged above the pressing part 200 and may be arranged on the opposite side of the mask frame MF to sandwich the pressing part 200 therebetween. In an embodiment, the header 300 may include a laser unit 310 that irradiates a laser beam, and a sensing unit 320 that photographs and senses an alignment state of the mask sheet MS.

The header 300 may fix the mask sheet MS to the mask frame MF by irradiating a laser beam toward the mask sheet MS. For example, the header 300 may weld the mask sheet MS and the mask frame MF by irradiating a welding laser beam. In an embodiment, the header 300 may cut the mask sheet MS by irradiating a laser beam toward the mask sheet MS. For example, the header 300 may laser-cut a portion of the mask sheet MS by irradiating a cutting laser beam. In an embodiment, the laser unit 310 may emit a laser beam by changing laser conditions, thereby emitting both a welding laser beam and a cutting laser beam.

The header 300 may photograph and sense an alignment state of the pattern hole PH of the mask sheet MS through the sensing unit 320. Based on this, by finely adjusting the position of the tensioning part 100 gripping the mask sheet MS, the mask sheet MS may be aligned to a desired position.

In an embodiment, the tensioning part 100, the pressing part 200, and the header 300 may be interlocked with one another and may move together on a side of the mask frame MF. For example, the tensioning part 100, the pressing part 200, and the header 300 may move together in the first direction DR1, the second direction DR2, and the third direction DR3 on the mask frame MF. In FIG. 4, the mask frame MF is shown having one opening OP. However, the mask frame MF may include a plurality of openings OP, and, in this case, the tensioning part 100, the pressing part 200, and the header 300 may move together to position the mask sheet MS on a corresponding opening OP. In an embodiment, the pressing part 200 is capable of performing relative motion relative to the tensioning part 100 and the header 300 while they are stationary.

Figure 5:
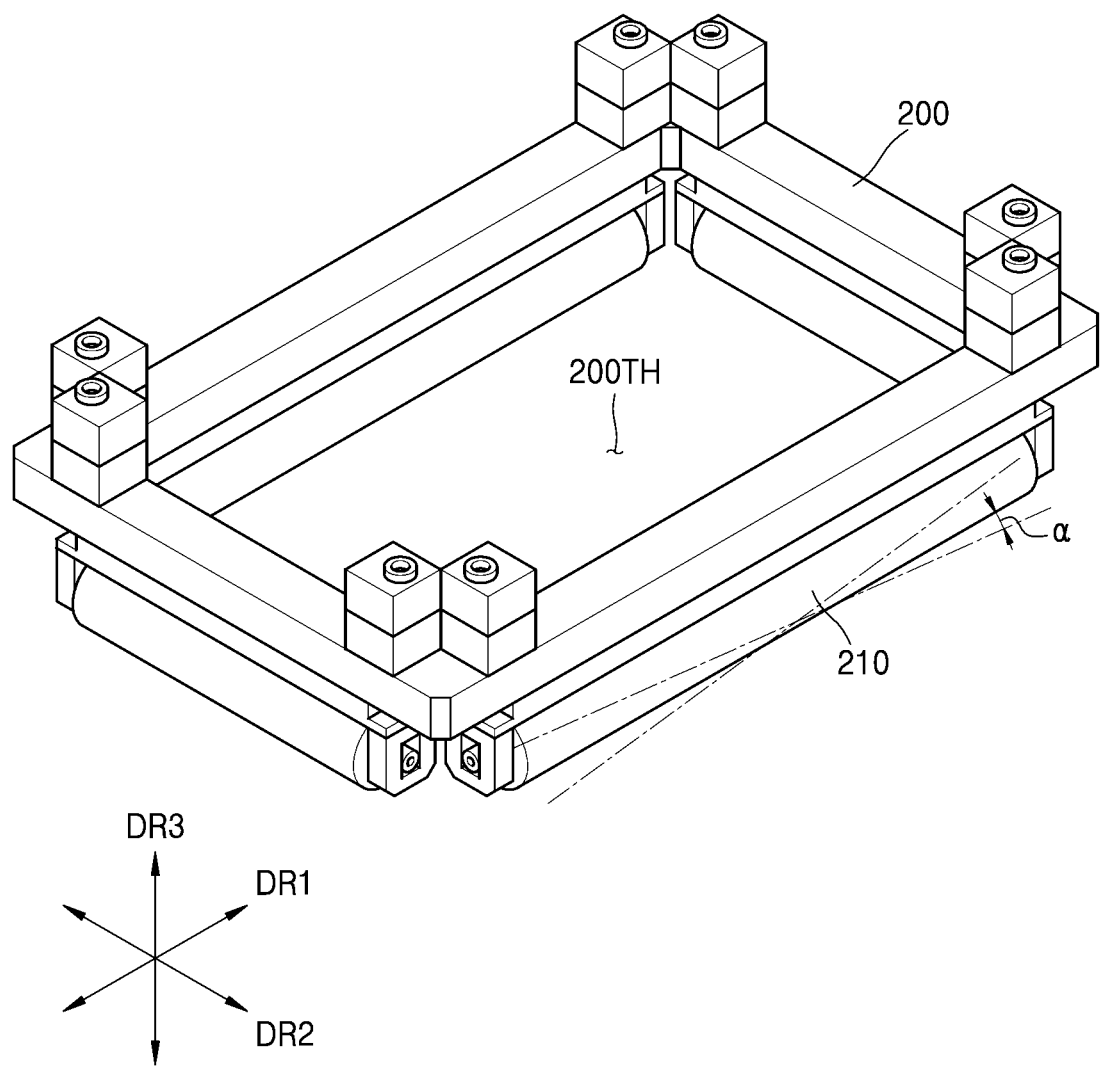
FIG. 5 is a schematic perspective view illustrating a portion of an apparatus for manufacturing a mask assembly, according to an embodiment.

FIG. 5 is a schematic perspective view illustrating a portion of an apparatus for manufacturing a mask assembly, according to an embodiment. FIG. 5 shows the pressing part 200 of the apparatus for manufacturing a mask assembly according to an embodiment.

Referring to FIG. 5, in an embodiment, the pressing part 200 has a quadrangular shape on a plane, but is not limited thereto. In an embodiment, the pressing part 200 may have a shape corresponding to the shape of the mask sheet MS (see FIG. 3), and may have any of various shapes, such as a circle, an oval, and a polygon, such as a triangle. In an embodiment, when the pressing part 200 has a polygonal shape, each corner of the pressing part 200 may be chamfered or filleted. The area of the planar shape of the pressing part 200 may be less than the area of the mask sheet MS including the cell area CA (see FIG. 3) and the dummy portion DP (see FIG. 3).

The pressing part 200 may include a through portion 200TH arranged at the center thereof. The through portion 200TH may correspond to the cell area CA (see FIG. 3) and the fixed area DP1 (see FIG. 3) of the dummy portion DP of the mask sheet MS. The through portion 200TH may be a through space formed to allow a laser beam of the header 300 (see FIG. 4) to pass through. The laser beam emitted from the header 300 may pass through the through portion 200TH to reach the mask sheet MS. In an embodiment, the through portion 200TH may have a quadrangular shape on a plane, or may have any of various shapes corresponding to the shape of the pressing part 200 (see FIG. 4).

At least two rollers 210 may be arranged on a surface of the pressing part 200 facing the mask sheet MS. For example, when two rollers 210 are arranged in the pressing part 200 having a quadrangular shape, the two rollers 210 may be arranged at opposite edges of the pressing part 200 to place the through portion 200TH therebetween. As such, a plurality of rollers 210 may be arranged to place the through portion 200TH therebetween. In this case, a longitudinal direction of the roller 210 may intersect with a tensile direction of the mask sheet MS. As another example, when four rollers 210 are arranged in the pressing part 200 having a quadrangular shape, the four rollers 210 may be arranged at four edges of the pressing part 200. Herein, for convenience of description, a case in which four rollers 210 are provided will be described.

The cross-section of each of the rollers 210 in a direction perpendicular to the longitudinal direction of the roller 210 may have a circular shape. For example, the cross-section of the roller 210 may have a diameter of about 1 mm to about 20 mm, and, in an embodiment, may have a diameter of about 2 mm to about 3 mm. The length of the roller 210 may be relatively greater than the diameter of the cross-section of the roller 210, and may be equal to or less than the length of a side of the pressing part 200.

The roller 210 may directly contact the dummy portion DP of the mask sheet MS. An area of the dummy portion DP directly contacting the roller 210 may be defined as the pressing area DP2. Because the roller 210 directly contacts the mask sheet MS, the roller 210 may include a flexible material such as rubber or urethane so as not to damage the mask sheet MS. In an embodiment, the roller 210 may include a shaft including a metal material to secure rigidity, and a contact portion including a flexible material as described above may be arranged on the surface of the shaft.

In an embodiment, the roller 210 of the pressing part 200 may be tilted. The roller 210 may directly contact the mask sheet MS and directly press the mask sheet MS as described below. In this case, in order to evenly press the mask sheet MS having a very small thickness, the surface of the roller 210 may require excellent straightness. However, a tolerance for straightness may occur when the roller 210 is manufactured, and the roller 210 may be finely tilted to compensate for the tolerance. Reference symbol α in FIG. 5 may indicate an angle at which the roller 210 is tilted. The angle α may be 0° to 90°.

Figure 6:
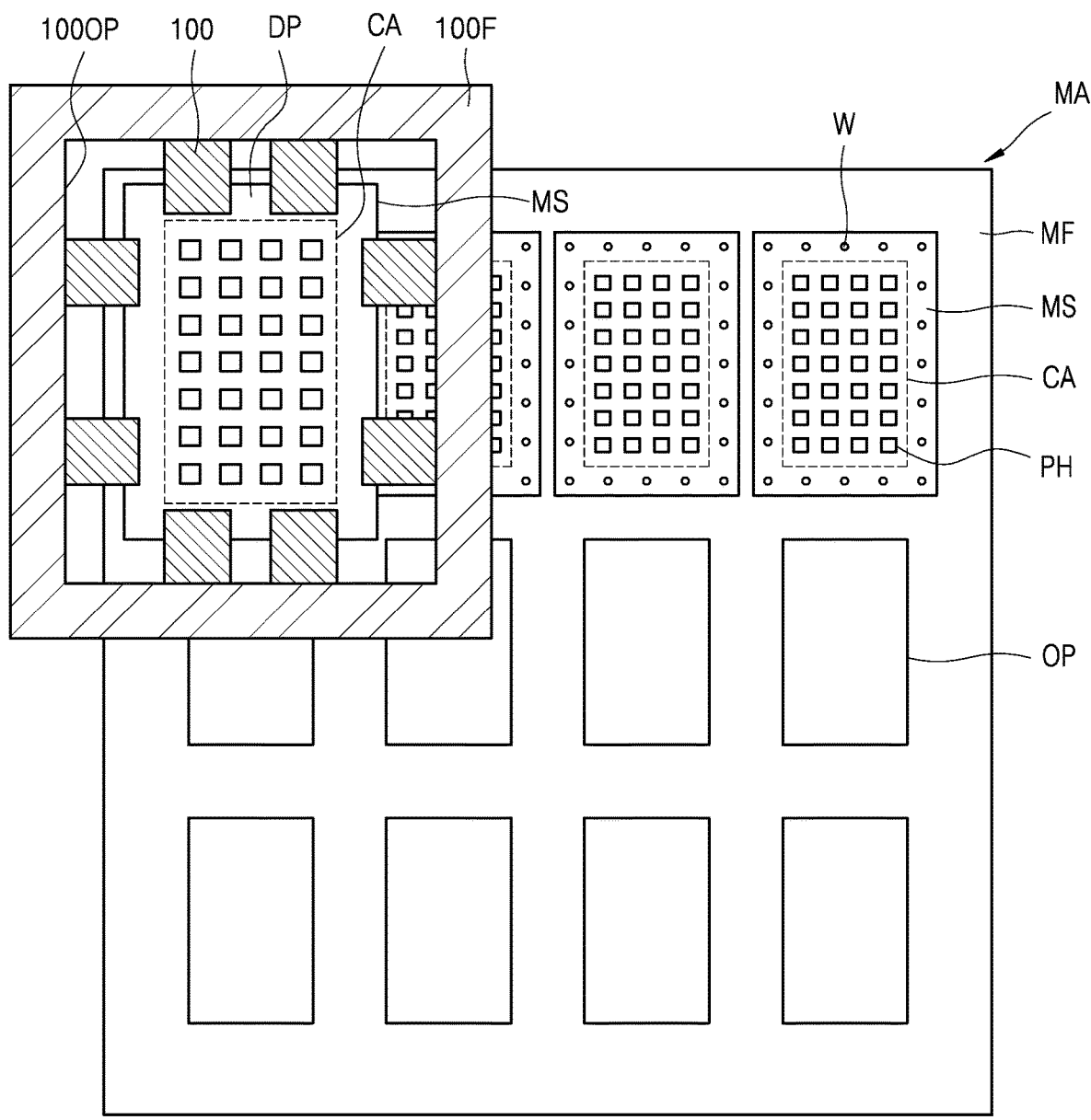
FIG. 6 is a schematic plan view illustrating a portion of a process of manufacturing a mask assembly by an apparatus for manufacturing a mask assembly, according to an embodiment.

FIG. 6 is a schematic plan view illustrating a portion of a process of manufacturing a mask assembly by an apparatus for manufacturing a mask assembly, according to an embodiment.

FIG. 6 shows a state in which a mask frame MF includes twelve openings OP, three of the twelve openings OP are respectively fixed to mask sheets MS corresponding thereto, and a fourth mask sheet MS corresponds to an opening OP. However, the number of openings OP in the mask frame MF and the order of fixing the mask sheets MS are merely examples, and are not limited thereto.

The tensioning part 100 may be arranged in a tensioning part frame 100F. The tensioning part frame 100F may include a frame opening 100OP at the center thereof, and the tensioning part 100 may be arranged along the inside of the frame opening 100OP. The tensioning part 100 may grip and tension the mask sheet MS within the frame opening 100OP. Tensioning parts 100 may be paired, and a pair of tensioning parts 100 may face each other. Although FIG. 6 illustrates an example in which eight tensioning parts 100 are provided, the present disclosure is not limited thereto, and at least two tensioning parts 100 may be provided.

In an embodiment, the planar shape of the frame opening 100OP may correspond to the shape of the mask sheet MS. For example, when the mask sheet MS is rectangular, the planar shape of the frame opening 100OP may also be rectangular. The area of the frame opening 100OP may be greater than the area of the opening OP of the mask frame MF and the area of the mask sheet MS including the cell area CA and the dummy portion DP. In this case, the area may denote an area on a plane in which the first direction DR1 and the second direction DR2, which are tensile directions of the mask sheet MS, extend.

The frame opening 100OP may be a through region through which the pressing part 200 and a laser beam emitted from the header 300 may pass. Therefore, the area of the frame opening 100OP may be greater than the area occupied by the pressing part 200 on a plane.

After the tensioning parts 100 facing each other grip the mask sheet MS, the tensioning part frame 100F may enter a region above the mask frame MF and arrange the mask sheet MS to correspond to the opening OP. The tensioning part frame 100F may move in the first direction DR1 and the second direction DR2, which may be performed by a frame moving part (not shown). In an embodiment, the frame moving part (not shown) may include a guide or rail for guiding the movement of the tensioning part frame 100F, and a combination of linear drivers such as a pneumatic cylinder, a linear motor, an electric motor with a v-belt, and an electric motor with a rack and pinion gear.

The tensioning part 100 according to an embodiment enters a region of the mask frame MF in order to grip the mask sheet MS and then arranges it to correspond to the opening OP. To this end, the tensioning part 100 may be arranged above the mask sheet MS and move in a region above the mask sheet MS.

Herein, a process in which the mask sheet MS corresponds to the opening OP and is fixed to the mask frame MF will be described.

FIGS. 7A to 7F are schematic cross-sectional views illustrating a process of manufacturing a mask assembly, according to an embodiment. Descriptions of a configuration that is the same as or similar to the mask assembly manufacturing apparatus described above with reference to FIG. 4 may be omitted, and the following description will be mainly focused on differences.

Referring to FIG. 7A, a mask frame MF having at least one opening OP may be prepared. In an embodiment, the opening OP in the mask frame MF may be formed through etching using a photoresist or laser processing.

Also, a mask sheet MS including a cell area CA corresponding to the opening OP and a dummy portion DP arranged outside the cell area CA may be prepared. The mask sheet MS may include a pattern hole PH arranged in the cell area CA. In an embodiment, the pattern hole PH may also be formed through etching using a photoresist or laser processing.

Grip parts 110 may be located to face each other. After the grip parts 110 grip both sides of the mask sheet MS, a moving part 120 may apply a tensile force to the mask sheet MS by moving the grip parts 110 in directions away from each other. Through this, it is possible to improve the alignment precision by allowing the mask sheet MS to be arranged on the mask frame MF in a flat state without sagging or warping due to a load.

Thereafter, the mask sheet MS may be aligned on a side of the mask frame MF. The tensioning part 100 may enter a region above the mask frame MF and may align the mask sheet MS on the mask frame MF such that the opening OP and the cell area CA of the mask sheet MS correspond to each other. In this case, the sensing unit 320 of the header 300 may photograph and sense an alignment state of the mask sheet MS, and may perform fine alignment of the mask sheet MS by using the photographed and sensed alignment state, thereby improving alignment precision.

Figure 7B:
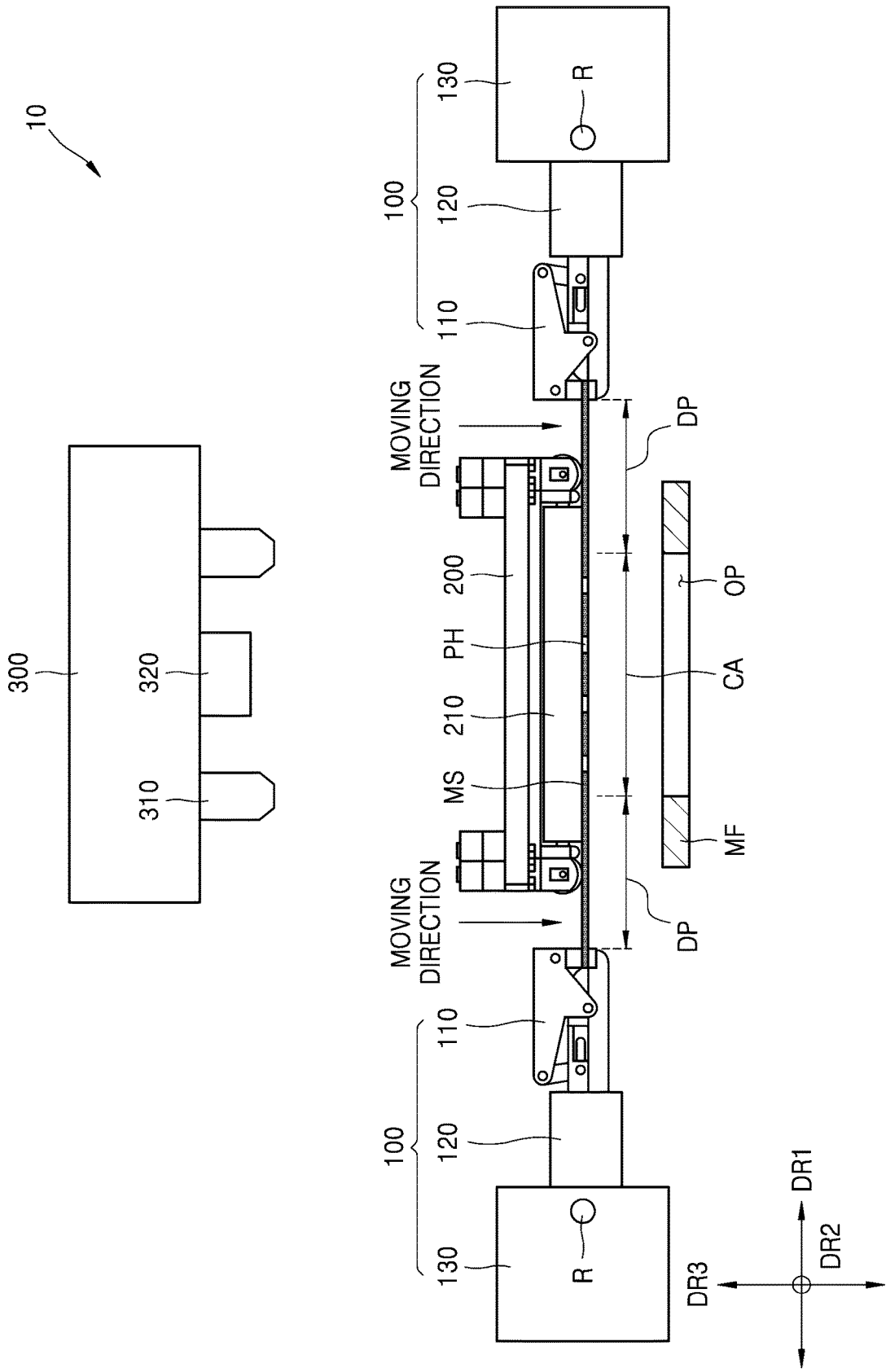

Referring to FIG. 7B, when the mask sheet MS is tensioned and is aligned on the mask frame MF, the pressing part 200 may move in the third direction DR3 toward the mask sheet MS. The pressing part 200 may directly contact the mask sheet MS and apply a force on the mask sheet MS in a direction toward the mask frame MF. For example, the roller 210 of the pressing part 200 may contact the dummy portion DP of the mask sheet MS and directly apply a force to the mask sheet MS.

Figure 7C:
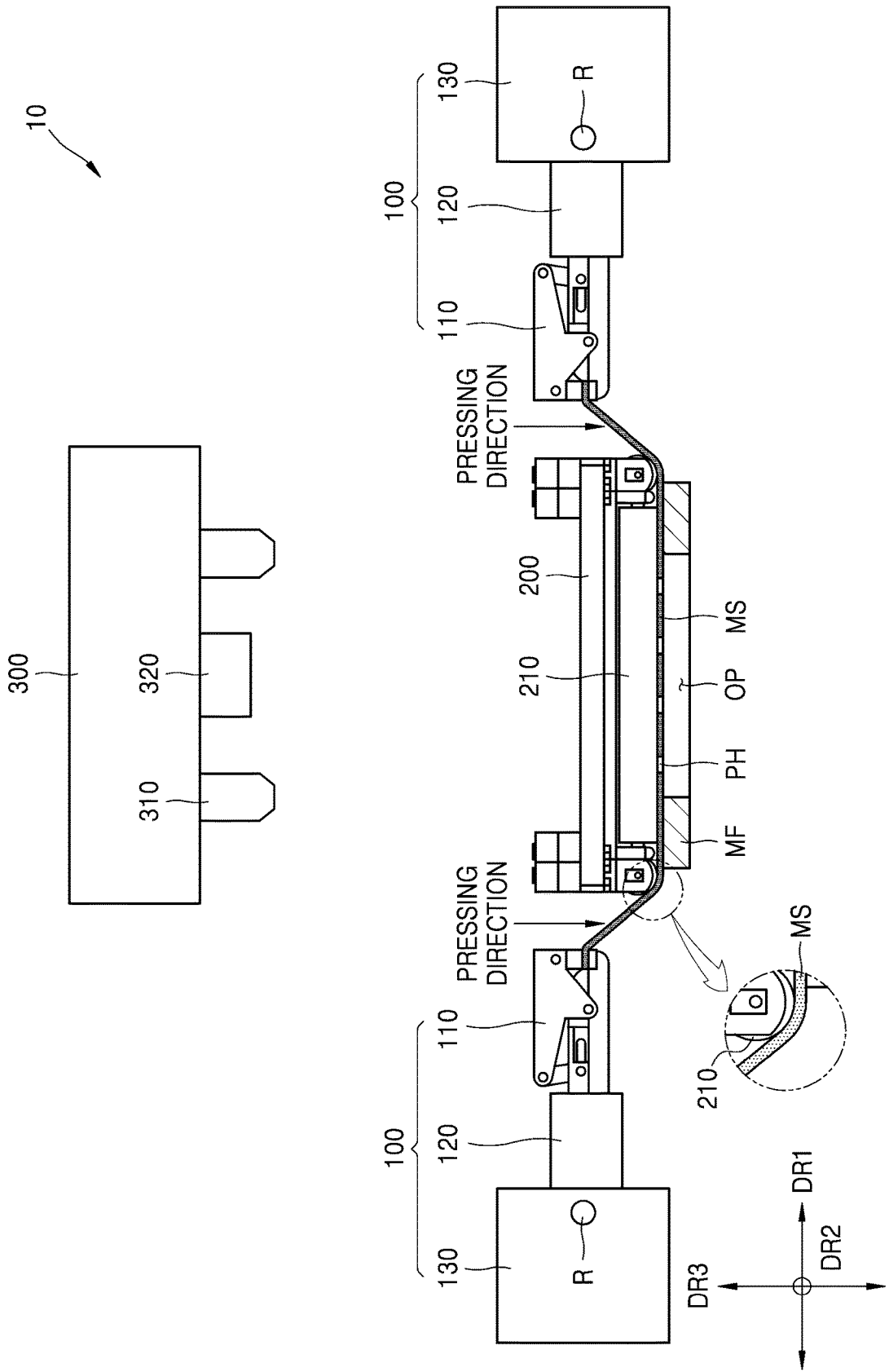

Referring to FIG. 7C, a portion of the mask sheet MS, which has received a force from the pressing part 200, may be bent. As a result, the mask sheet MS may be bent such that the cell area CA of the mask sheet MS is closer to the mask frame MF than the edge of the dummy portion DP gripped by the grip part 110. The cell area CA of the mask sheet MS may descend in the third direction DR3 from a position before the mask sheet MS is bent to a position after the mask sheet MS is bent. A portion of the dummy portion DP directly receiving a force applied by the roller 210 may be bent along the surface of the roller 210. Therefore, the bent portion of the dummy portion DP may be rounded or curved.

The pressing part 200 may bend the mask sheet MS until a portion of the mask sheet MS comes into contact with the mask frame MF. In this case, the portion in contact with the mask frame MF may be substantially the pressing area DP2 of the dummy portion DP of the mask sheet MS.

According to an embodiment, by controlling the movable range of the pressing part 200 in the third direction DR3, the degree of bending of the mask sheet MS and the degree of descending of the cell area CA may be adjusted. The degree of bending may denote an angle at which the mask sheet MS is bent, and the degree of descending may denote a difference in position of the cell area CA before and after bending. According to an embodiment, because the tensioning part 100 for tensioning the mask sheet MS and a separate pressing part 200 are provided, it may be easy to increase the movable range of the pressing part 200, and, thus, it may be easy to increase the degree of bending of the mask sheet MS and the degree of descending of the cell area CA. In addition, because a force is directly applied to the mask sheet MS by the pressing part 200 and, thus, the mask sheet MS comes into contact with the mask frame MF, adhesion between the mask sheet MS and the mask frame MF may be improved. Through this, it is possible to improve the manufacturing quality of the mask assembly MA.

As a comparative example, when the mask sheet MS is sharply bent, stress may be concentrated, and, thus, the mask sheet MS may be damaged. In addition, the possibility of plastic deformation occurring beyond the elastic deformation of the mask sheet MS increases, and, as a result, it may be difficult for the mask sheet MS to be fixed to the mask frame MF in a flat state. However, according to an embodiment, because the dummy portion DP of the mask sheet MS is bent to be rounded along the surface of the roller 210, stress concentration may be relieved and the possibility of damage to the mask sheet MS may be reduced. In addition, the possibility of plastic deformation of the mask sheet MS may be reduced, and a tensile force may be sufficiently applied to the mask sheet MS and fixed to the mask frame MF in a flat state without sagging or warping. Through this, it is possible to manufacture a high-quality mask assembly MA with improved alignment precision.

Figure 7D:
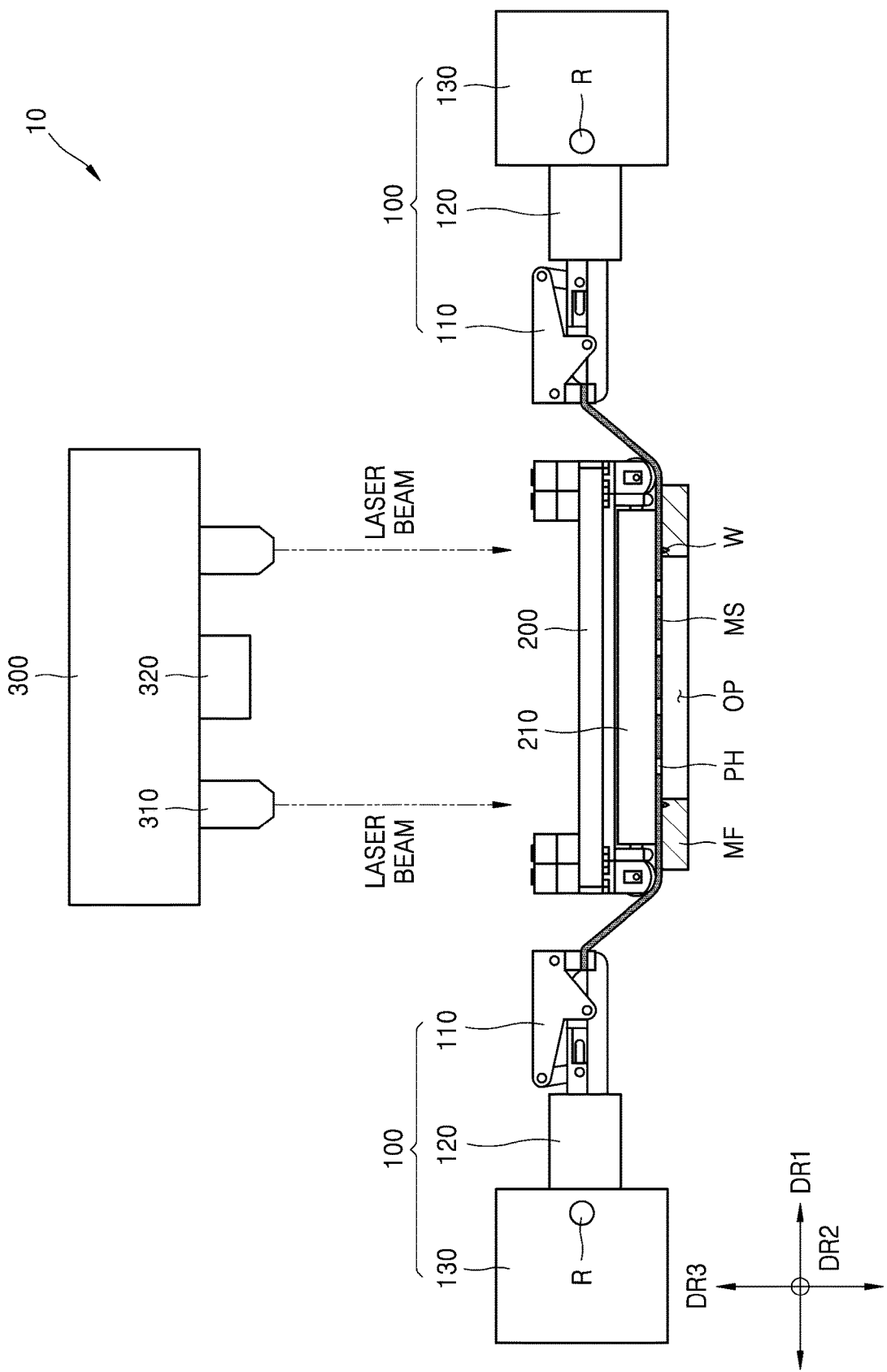

Referring to FIG. 7D, in a state in which the mask sheet MS is in contact with the tensioning part frame 100F, the header 300 may irradiate a laser beam to a portion of the mask sheet MS and fix the mask frame MF and the mask sheet MS. For example, laser welding may be performed by irradiating a laser beam on the fixed area DP1 of the dummy portion DP of the mask sheet MS. A welding point W may be formed in an area irradiated with the laser beam, and, thus, the mask sheet MS may be fixed to the mask frame MF. In an embodiment, irradiation of the laser beam may be repeatedly performed, and a plurality of welding points W may be formed. The welding point W may be in the form of a dot or a spot, and may be in the form of a line without being limited to a point.

As such, the mask sheet MS may be fixed on the mask frame MF in a state of receiving a tensile force. Therefore, the mask sheet MS may be arranged on the mask frame MF in a flat state without sagging or warping due to its own load.

Figure 7E:
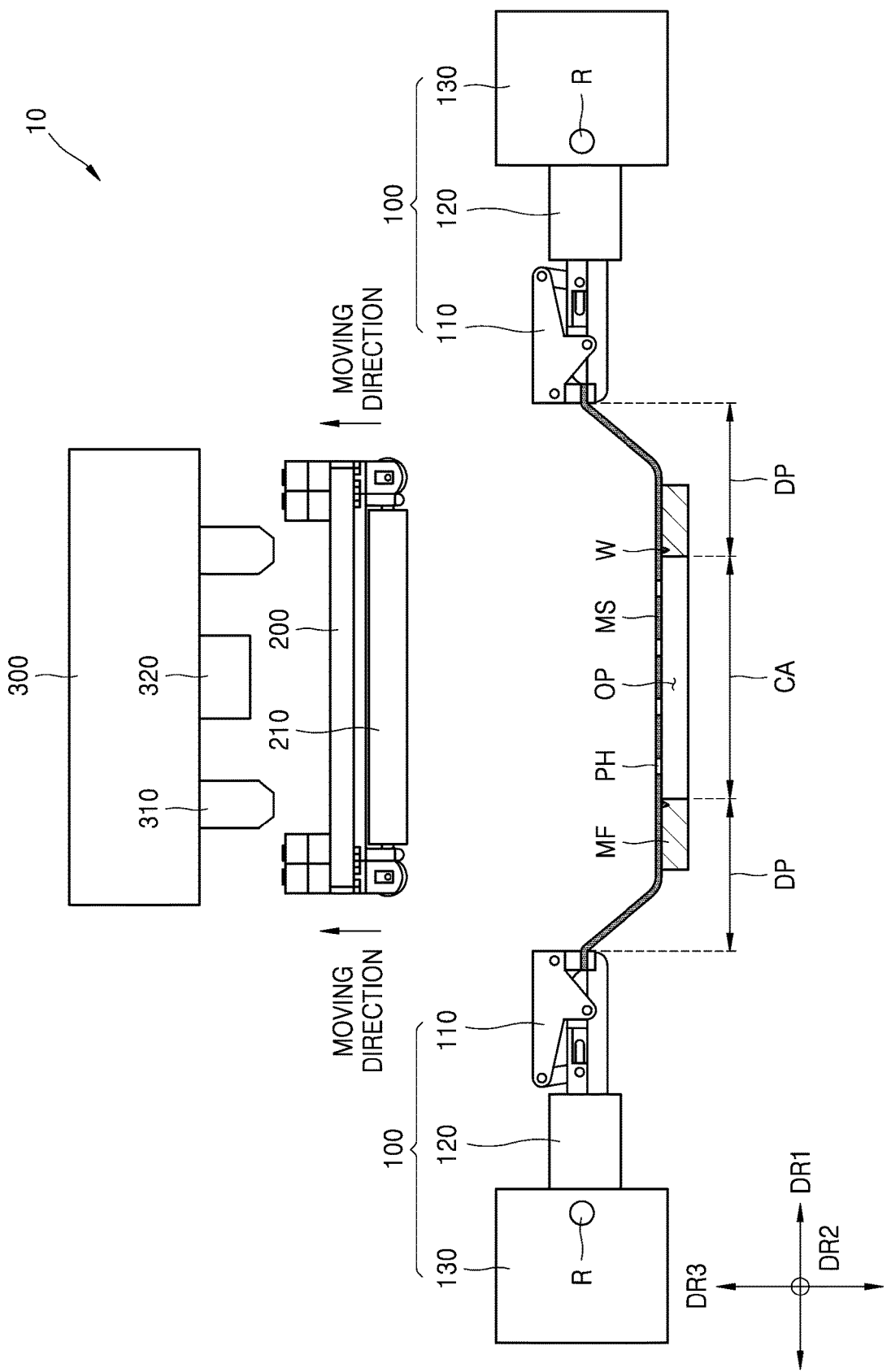

Referring to FIG. 7E, when the fixing of the mask sheet MS is completed, the pressing part 200 may return to an initial position away from the mask frame MF in the third direction DR3.

Referring to FIG. 7F, the header 300 may cut the mask sheet MS around the cell area CA by irradiating a laser beam to the mask sheet MS. For example, the header 300 may cut the mask sheet MS around the cell area CA by irradiating a cutting laser beam to the mask sheet MS. In FIG. 7F, a cut position is indicated by reference symbol t. In this case, a position where the cutting laser beam is irradiated may be outside a portion where the welding point W is located. To this end, the position of a laser unit 310 of the header 300 may be adjusted outward from a position where welding is performed. By cutting a portion of the mask sheet MS, a portion of the dummy portion DP may be separated from the cell area CA. As a result, only the cell area CA and the fixed area DP1 of the mask sheet MS may be left in the mask frame MF.

Through the above-described process, the mask sheet MS aligned on the mask frame MF may be fixed in a tensioned state. By repeatedly performing these processes, the mask assembly MA may be manufactured.

Figure 8:
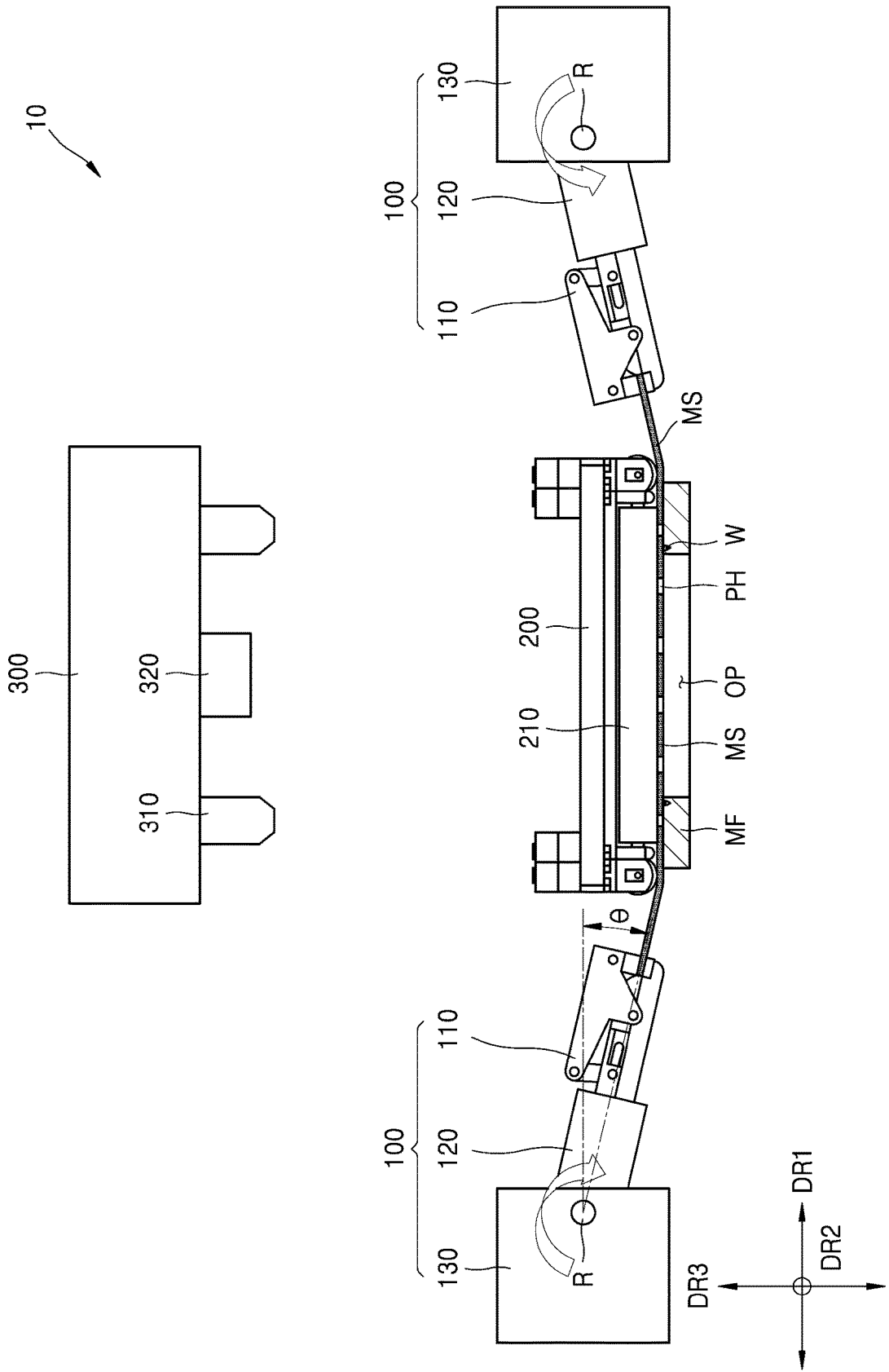
FIG. 8 is a schematic cross-sectional view illustrating a portion of a process of manufacturing a mask assembly by an apparatus for manufacturing a mask assembly, according to an embodiment.

FIG. 8 is a schematic plan view illustrating a portion of a process of manufacturing a mask assembly by an apparatus for manufacturing a mask assembly, according to an embodiment. Descriptions of a configuration that is the same as or similar to the mask assembly manufacturing apparatus described above with reference to FIG. 4 may be omitted, and the following description will be mainly focused on differences.

The tensioning part 100 may include a rotator 130 that rotates the grip part 110 around a rotation axis R parallel to a surface of the mask frame MF. The rotation axis R may intersect with a tensile direction of the mask sheet MS, for example, and may perpendicularly intersect with the mask sheet MS. The rotation axes R of the tensioning parts 100 facing each other may be parallel to each other.

As described above with reference to FIG. 4, the rotator 130 may include a rotating driver (not shown), such as a servo motor, a pneumatic motor, a rotating cylinder, a motor having a v-belt, or the like, and thus may rotate the grip part 110 by a first angle θ. The rotation direction may be a direction in which the grip part 110 rotates toward the mask frame MF. The first angle θ may be 0° to 90°.

When the pressing part 200 bends the mask sheet MS by applying a force to the mask sheet MS, the rotator 130 may rotate correspondingly. When a force is applied to the mask sheet MS by the pressing part 200, a portion of the mask sheet MS gripped by the grip part 110 may be bent. Plastic deformation may occur in the bent portion, and, in a worst case, the mask sheet MS may be undesirably broken. Therefore, the rotator 130 may prevent or reduce undesirable breakage of the mask sheet MS.

Figure 9:
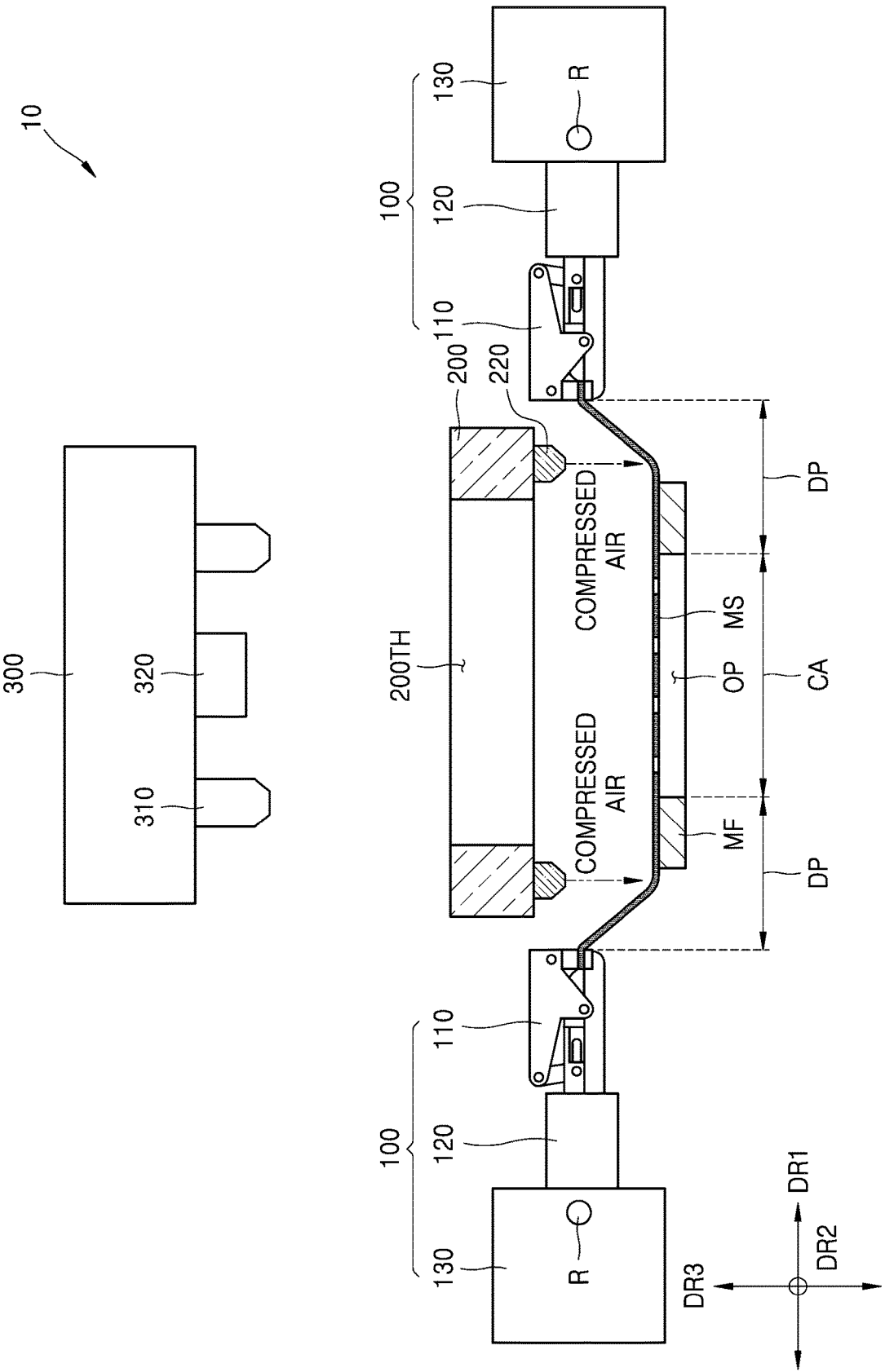
FIG. 9 is a schematic cross-sectional view illustrating a portion of a process of manufacturing a mask assembly by an apparatus for manufacturing a mask assembly, according to another embodiment.

FIG. 9 is a schematic plan view illustrating a portion of a process of manufacturing a mask assembly by an apparatus for manufacturing a mask assembly, according to another embodiment. Descriptions of a configuration that is the same as or similar to the mask assembly manufacturing apparatus described above with reference to FIG. 4 may be omitted, and the following description will be mainly focused on differences.

Referring to FIG. 9, in an embodiment, at least two injection holes, that is, a plurality of injection holes 220, may be provided on a surface of the pressing part 200 facing the mask sheet MS. The plurality of injection holes 220 may be arranged along an edge of the pressing part 200. The plurality of injection holes 220 may be arranged to correspond to the pressing area DP2 of the dummy portion DP.

Each of the injection holes 220 may spray compressed air toward the mask sheet MS. For example, the injection hole 220 may bend a portion of the mask sheet MS by spraying compressed air to the pressing area DP2 of the dummy portion DP of the mask sheet MS.

Although the mask sheet MS includes a metal material, the mask sheet MS is a thin film having a very small thickness compared to the length thereof, and, thus, a portion of the mask sheet MS may be sufficiently bent using compressed air. Compressed air may be intensively injected into the portion to bend, but the compressed air may spread around the portion after reaching the portion. In this case, the greatest pressure may be applied to the portion to bend, and a continuously reduced pressure may be applied to an area around the portion. Through this, a portion of the mask sheet MS may be bent to be rounded. Therefore, as described above, stress concentration in the bent portion may be reduced, and the possibility of damage to the mask sheet MS may be reduced.

In addition, by bending the mask sheet MS in a non-contact manner, it is possible to reduce a physical impact applied to the mask sheet MS and reduce the possibility of damage to the mask sheet MS. In addition, because the pressing part 200 does not need to descend in the third direction DR3 until the mask sheet MS comes into contact with the mask frame MF, the movable range of the pressing part 200 may be reduced.

Figure 10:
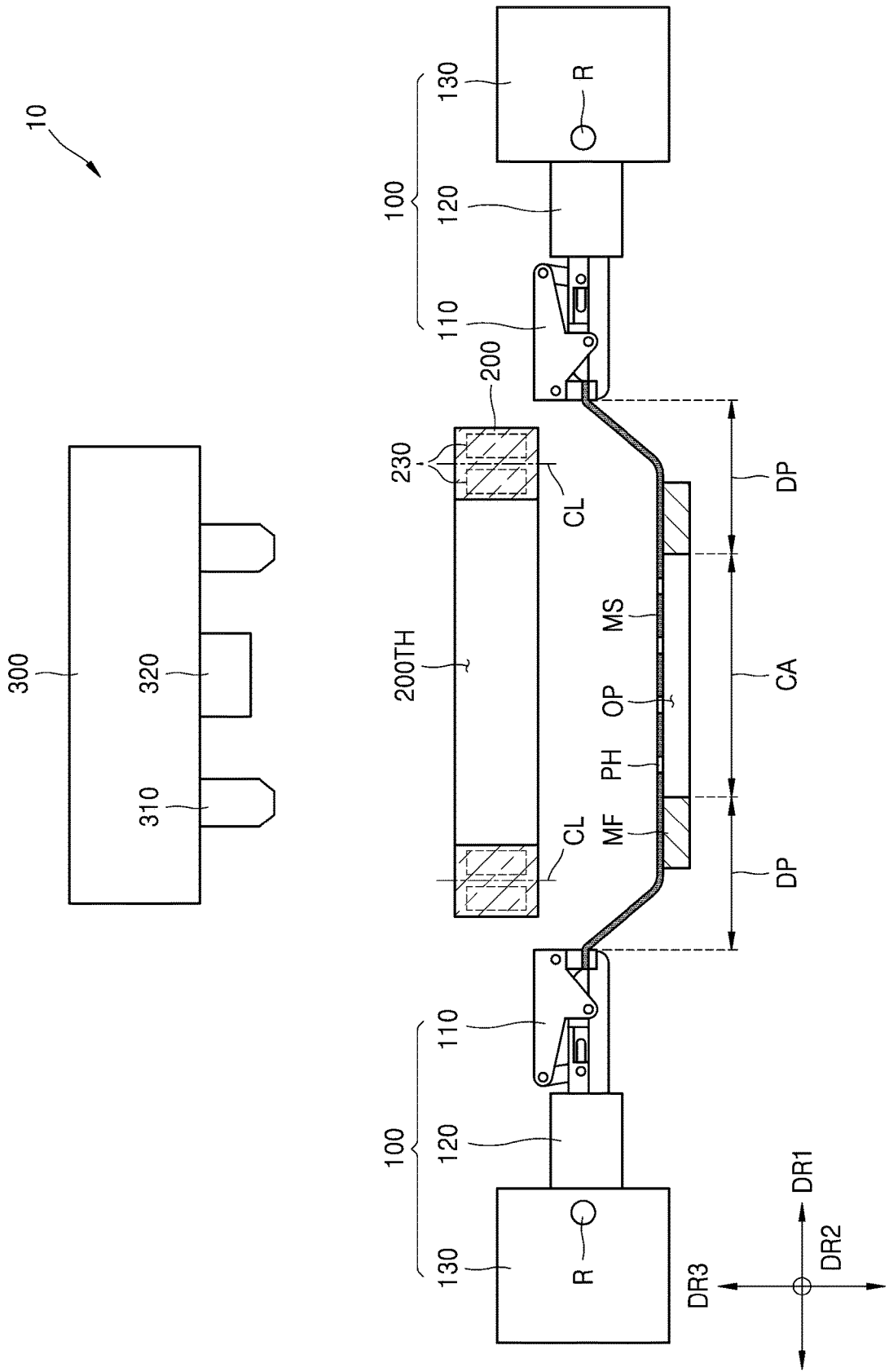
FIG. 10 is a schematic cross-sectional view illustrating a portion of a process of manufacturing a mask assembly by an apparatus for manufacturing a mask assembly, according to another embodiment.

FIG. 10 is a schematic plan view illustrating a portion of a process of manufacturing a mask assembly by an apparatus for manufacturing a mask assembly, according to another embodiment. Descriptions of a configuration that is the same as or similar to the mask assembly manufacturing apparatus described above with reference to FIG. 4 may be omitted, and the following description will be mainly focused on differences.

Referring to FIG. 10, the pressing part 200 may include a plurality of magnets 230. The magnets 230 may be embedded in the pressing part 200 or arranged on an outer surface of the pressing part 200. Herein, for convenience of description, a case in which the magnets 230 are embedded in the pressing part 200 will be described. The magnets 230 may be arranged to correspond to the dummy portion DP of the mask sheet MS. The magnets 230 may be permanent magnets or electromagnets.

By properly arranging the plurality of magnets 230, the pressing part 200 may apply a magnetic force in the third direction DR3 to the mask sheet MS. For example, a pair of magnets 230 may be arranged with a center line CL therebetween, and directions of the magnetic dipoles of the pair of magnets 230 may be opposite to each other. In this case, an upward magnetic force may be applied to a portion of the dummy portion DP corresponding to the position of the magnets 230, and a downward magnetic force may be applied to another portion of the dummy portion DP corresponding to the center line CL. Magnetic forces in opposite directions may be applied to the portion and the other portion of the dummy portion DP, and, thus, the dummy portion DP may be bent. In an embodiment, a ferromagnetic material or the like may be arranged along an inner surface of the through portion 200TH of the pressing part 200 and shield a magnetic force to prevent or substantially prevent the magnetic force from being applied to the cell area CA other than the dummy portion DP.

As another example, each of the magnets 230 may include a ferromagnetic material, and the dummy portion DP of the mask sheet MS may include a diamagnetic material. In this case, the dummy part DP may receive a magnetic force in a direction away from the magnets 230. However, because at least both side edges of the dummy portion DP are fixed by the grip part 110, the dummy portion DP may be bent in the end.

Figure 11:
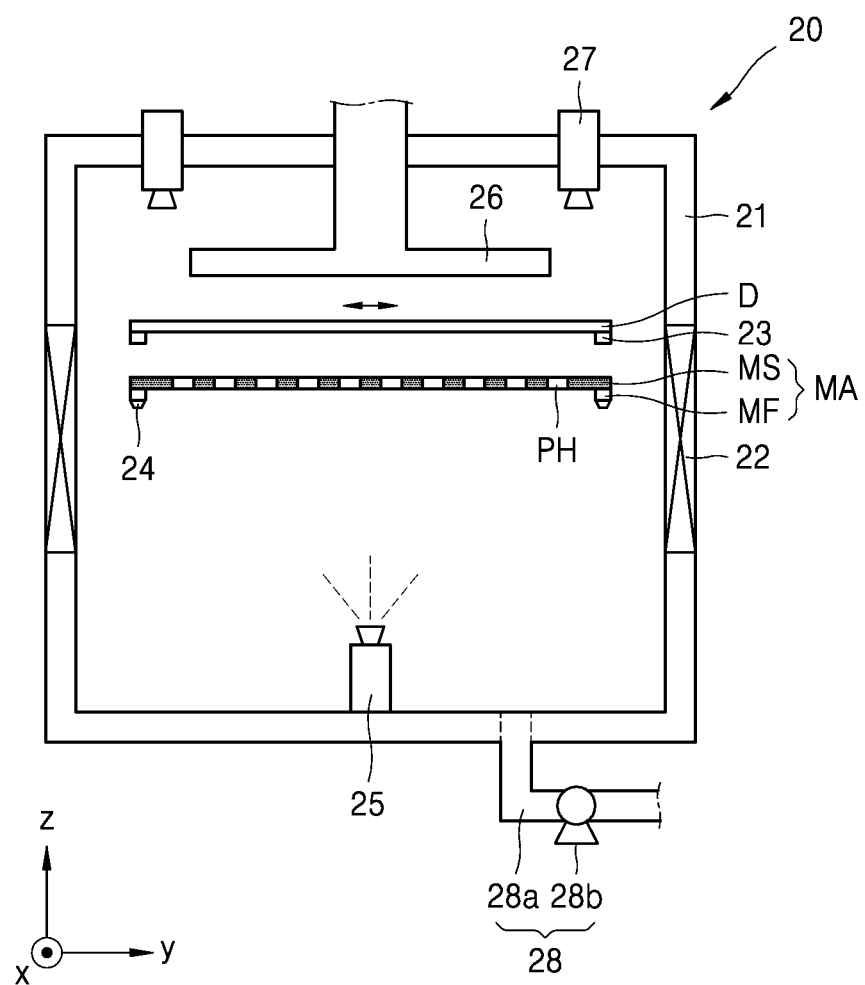
FIG. 11 is a schematic cross-sectional view illustrating an apparatus for manufacturing a display device, according to an embodiment.

FIG. 11 is a schematic cross-sectional view illustrating an apparatus 20 (herein, referred to as a display device manufacturing apparatus) for manufacturing a display device, according to an embodiment.

Referring to FIG. 11, a display device 30 (see FIG. 12) may be manufactured by the display device manufacturing apparatus 20.

In an embodiment, the display device manufacturing apparatus 20 may include a chamber 21, the mask assembly MA, a first supporter 23, a second supporter 24, a deposition source 25, a magnetic force generator 26, a vision portion 27, and a pressure controller 28.

The chamber 21 may have a space formed therein, and a portion of the chamber 21 may be opened. In this case, a gate valve 22 may be arranged to be opened and closed in the opened portion of the chamber 21.

The mask assembly MA may be selectively arranged inside the chamber 21. In this case, the mask assembly MA may include the mask frame MF and the mask sheet MS. The mask sheet MS may be fixed to the mask frame MF in a tensioned state. The mask sheet MS may include at least one pattern hole PH.

A display substrate D may be seated on the first supporter 23. In this case, the first supporter 23 may adjust the position of the display substrate D. For example, the first supporter 23 may include a UVW stage.

The mask assembly MA may be seated on the second supporter 24. In this case, the second supporter 24 may adjust the position of the mask assembly MA similarly to the first supporter 23.

At least one of the first supporter 23 and the second supporter 24 may be elevated and/or lowered inside the chamber 21. In this case, at least one of the first supporter 23 and the second supporter 24 may adjust a distance between the display substrate D and the mask frame MF.

In an embodiment, the deposition source 25 may supply a deposition material to the chamber 21 by vaporizing or sublimating the deposition material after the deposition material is received. In this case, the deposition source 25 may include a heater therein, and may melt or sublimate the deposition material by heating the deposition material in the deposition source 25 by the operation of the heater. In this case, the deposition source 25 may be arranged at the center or edge of the chamber 21.

The magnetic force generator 26 may be arranged in the chamber 21 and bring the mask assembly MA into close contact with the display substrate D. In this case, the magnetic force generator 26 may include an electromagnet or a permanent magnet that generates magnetic force.

The vision portion 27 may be arranged in the chamber 21 to photograph the positions of the mask assembly MA and the display substrate D. In this case, the vision portion 27 may photograph an alignment mark or the like of at least one of the mask assembly MA and the display substrate D.

The pressure controller 28 may be connected to the chamber 21 to adjust a pressure inside the chamber 21. In an embodiment, the pressure controller 28 may include a connection pipe 28*a* connected to the chamber 21 and a pump 28*b* arranged in the connection pipe 28*a*.

Figure 13:
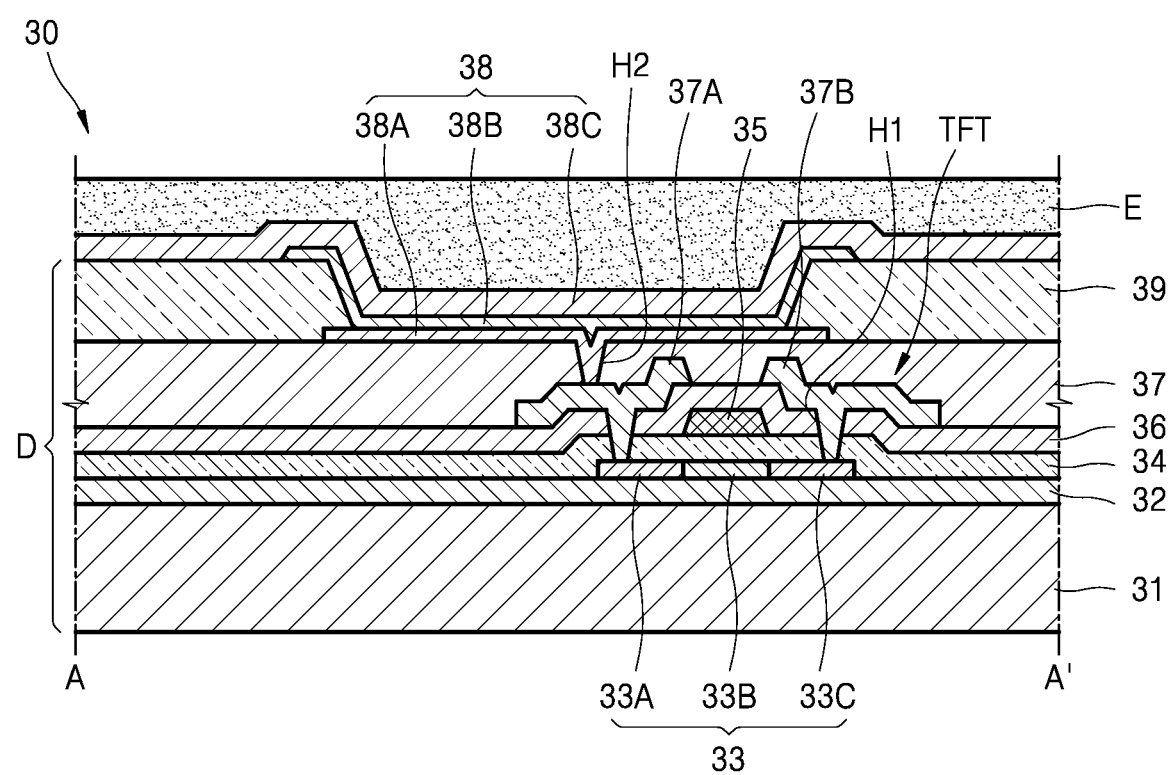
FIG. 13 is a schematic cross-sectional view illustrating a portion of the display device of FIG. 12.

With respect to the operation of the display device manufacturing apparatus 20, the gate valve 22 may be opened in a state in which the pressure controller 28 keeps pressure inside the chamber 21 equal to or similar to atmospheric pressure, and then the display substrate D and the mask assembly MA may be inserted into the chamber 21. In this case, at least one of the display substrate D and the mask assembly MA may be moved through a separate robot arm arranged outside the chamber 21 or a shuttle inserted in or withdrawn from the chamber 21. In this case, the display substrate D may be in a state in which, for example, a pixel-defining layer 39, a pixel electrode 38A, and layers arranged under the pixel-defining layer 39, as shown in FIG. 13, are formed.

After the mask frame MF and the display substrate D are arranged on the second supporter 24 and the first supporter 23, respectively, the positions of the mask frame MF and the display substrate D may be detected by the vision portion 27 and aligned. Thereafter, the display substrate D and the mask frame MF may be brought into close proximity to each other, and then the mask frame MF and the display substrate D may be brought into close contact with each other by the magnetic force generator 26.

When a deposition material is discharged from the deposition source 25, the deposition material may be deposited on the display substrate D through the pattern hole PH of the mask sheet MS to form a pattern. In this case, the deposition material may be deposited on the display substrate D to form, for example, an intermediate layer (e.g., an intermediate layer 38B in FIG. 13) or at least one sub-layer constituting an intermediate layer.

When the above process is completed, the display substrate D may be taken out of the chamber 21 or moved to another location of the chamber 21 to form another layer on the display substrate D.

Figure 12:
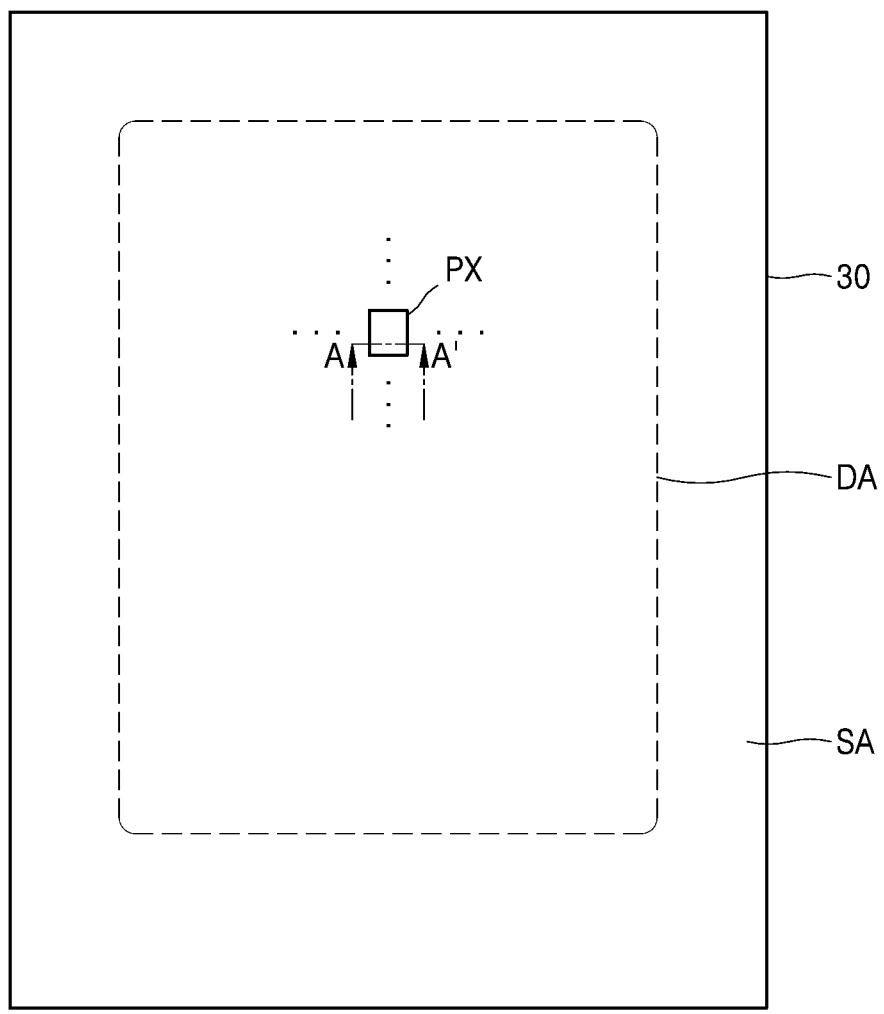
FIG. 12 is a schematic plan view illustrating a display device manufactured by an apparatus for manufacturing a display device, according to an embodiment.

FIG. 12 is a schematic plan view illustrating the display device 30 manufactured by a display device manufacturing apparatus, according to an embodiment.

Referring to FIG. 12, the display device 30 may include a display area DA and a surrounding area SA located outside the display area DA. The display device 30 may provide an image through an array of pixels PX two-dimensionally arranged in the display area DA. The surrounding area SA is an area that does not provide an image, and may completely or partially surround the display area DA. A driver or the like for providing electrical signals or power to the pixels PX may be arranged in the surrounding area SA. In the surrounding area SA, a pad that is an area to which an electronic device or a printed circuit board may be electrically connected may be arranged.

FIG. 13 is a schematic cross-sectional view illustrating a portion of the display device 30 of FIG. 12. FIG. 13 may correspond to a cross-section of the display device 30 taken along the line A-A' of FIG. 12.

Referring to FIG. 13, in an embodiment, the display device 30 may include the display substrate D, the intermediate layer 38B, an opposite electrode 38C, and an encapsulation layer. In an embodiment, the display substrate D may include a substrate 31, a buffer layer 32, a thin-film transistor TFT, a planarization layer 37, the pixel electrode 38A, and the pixel-defining layer 39. In addition, the encapsulation layer may include an encapsulation substrate (not shown), which may be the same as or similar to the substrate 31, or a thin-film encapsulation layer E. When the encapsulation layer includes the encapsulation substrate, a sealing member (not shown) may be arranged between the substrate 31 and the encapsulation substrate. However, herein, for convenience of description, a description will be given focusing on the case in which the encapsulation layer includes the thin-film encapsulation layer E.

In an embodiment, the substrate 31 may have a multilayer structure including a base layer including a polymer resin and an inorganic layer. For example, the substrate 31 may include a base layer including a polymer resin and a barrier layer of an inorganic insulating layer.

The buffer layer 32 may be arranged on the substrate 31. The buffer layer 32 may reduce or block the penetration of foreign matter, moisture, or external air from a lower portion of the substrate 31 and may provide a flat surface on the substrate 31. The buffer layer 32 may include an inorganic insulating material, such as silicon oxide, silicon oxynitride, or silicon nitride, and may have a single layer or multi-layer structure including the materials described above.

After an active layer 33 arranged in a certain pattern is formed on the buffer layer 32, the active layer 33 may be covered by a gate insulating layer 34. The active layer 33 may include a source region 33C and a drain region 33A, and may further include a channel region 33B therebetween.

The active layer 33 may include any of various materials. For example, the active layer 33 may include an inorganic semiconductor material, such as amorphous silicon or crystalline silicon. As another example, the active layer 33 may include an oxide semiconductor. As another example, the active layer 33 may include an organic semiconductor material. However, herein, for convenience of description, the case in which the active layer 33 includes amorphous silicon will be mainly described in further detail.

In an embodiment, the active layer 33 may be formed by forming an amorphous silicon film on the buffer layer 32, crystallizing the amorphous silicon film to form a polycrystalline silicon film, and patterning the polycrystalline silicon film. In the active layer 33, the source region 33C and the drain region 33A may be doped by impurities according to the type of the thin-film transistor TFT, such as a driving thin-film transistor or a switching thin-film transistor.

A gate electrode 35 corresponding to the active layer 33 and an interlayer insulating layer 36 covering the gate electrode 35 may be formed on an upper surface of the gate insulating layer 34.

Then, after a contact hole H1 is formed in the interlayer insulating layer 36 and the gate insulating layer 34, a source electrode 37B and a drain electrode 37A may be formed on the interlayer insulating layer 36 to contact the source region 33C and the drain region 33A, respectively.

The planarization layer 37 may be formed on the thin-film transistor TFT formed as described above, and the pixel electrode 38A of an organic light-emitting diode (OLED) 38 may be formed on the planarization layer 37. The pixel electrode 38A may contact the drain electrode 37A of the thin-film transistor TFT through a via hole H2 formed in the planarization layer 37. The planarization layer 37 may include an inorganic material and/or an organic material, and may include a single layer or two or more layers. The planarization layer 37 may be formed as a planarization film such that an upper surface thereof is flat regardless of the irregularities of an underlying film. On the other hand, the planarization layer 37 may be formed such that irregularities are made along the irregularities of the underlying film. In an embodiment, the planarization layer 37 may include a transparent insulator to achieve a resonance effect.

After the pixel electrode 38A is formed on the planarization layer 37, the pixel-defining layer 39 may be formed to cover at least portions of the pixel electrode 38A and the planarization layer 37, and an opening may be formed in the pixel-defining layer 39 to expose the pixel electrode 38A. In addition, the intermediate layer 38B and the opposite electrode 38C may be formed on the pixel electrode 38A.

In an embodiment, the pixel electrode 38A functions as an anode electrode, and the opposite electrode 38C functions as a cathode electrode. However, the polarity of the pixel electrode 38A and the polarity of the opposite electrode 38C may be reversed.

The pixel electrode 38A and the opposite electrode 38C are insulated from each other by the intermediate layer 38B, and apply voltages of different polarities to the intermediate layer 38B such that light is emitted from an organic emission layer.

The intermediate layer 38B may include the organic emission layer. As another alternative example, the intermediate layer 38B includes an organic emission layer, and may further include at least one of a hole injection layer, a hole transport layer, an electron transport layer, and an electron injection layer. The present embodiment is not limited thereto, and the intermediate layer 38B may include an organic emission layer and may further include various other functional layers (not shown).

In an embodiment, the thin-film encapsulation layer E may include a plurality of inorganic layers, or may include an inorganic layer and an organic layer.

In an embodiment, the organic layer of the thin-film encapsulation layer E may include a polymer-based material. Examples of the polymer-based material may include acrylic resin, epoxy resin, polyimide, and polyethylene. For example, the organic layer may include an acrylic resin, such as polymethyl methacrylate or polyacrylic acid. The organic layer may be formed by curing a monomer or applying a polymer.

The inorganic layer of the thin-film encapsulation layer E may include an inorganic insulating material. In an embodiment, the inorganic insulating material may include aluminum oxide, titanium oxide, tantalum oxide, hafnium oxide, zinc oxide, silicon oxide, silicon nitride, and/or silicon oxynitride.

In an embodiment, a top layer of the thin-film encapsulation layer E, which is exposed to the outside, may include an inorganic layer to prevent or substantially prevent moisture permeation to the OLED.

In an embodiment, the thin-film encapsulation layer E may include at least one sandwich structure in which at least one organic layer is between at least two inorganic layers. As another example, the thin-film encapsulation layer E may include at least one sandwich structure in which at least one inorganic layer is between at least two organic layers. As another example, the thin-film encapsulation layer E may include a sandwich structure in which at least one organic layer is between at least two inorganic layers, and a sandwich structure in which at least one inorganic layer is between at least two organic layers.

In an embodiment, the thin-film encapsulation layer E may include a first inorganic layer, a first organic layer, and a second inorganic layer sequentially from the top of the OLED. As another example, the thin-film encapsulation layer E may include a first inorganic layer, a first organic layer, a second inorganic layer, a second organic layer, and a third inorganic layer sequentially from the top of the OLED.

A metal layer, an organic layer, or an inorganic layer positioned on the entire surface of the display area DA of the display device 30 may be formed at an accurate position by using the display device manufacturing apparatus 20 according to one or more embodiments of the present disclosure. For example, the opposite electrode 38C and the thin-film encapsulation layer E may be formed at an accurate position by using the display device manufacturing apparatus 20. Through this, the display device 30 having uniform quality may be manufactured.

According to one or more embodiments as described above, an apparatus for manufacturing a mask assembly, a method of manufacturing a mask assembly, and a method of manufacturing a display device, which may miniaturize the size of a mask sheet, reduce deformation of the mask sheet, improve mask alignment precision, and shorten a process time required to manufacture a mask assembly, may be implemented. However, the scope of the present disclosure is not limited by these aspects and effects.

It is to be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

What is claimed is:

1. An apparatus for manufacturing a mask assembly, the apparatus comprising:
   a tensioning part configured to be spaced apart from a mask frame comprising at least one opening, the tensioning part configured to tension a mask sheet in at least one of a first direction and a second direction, the mask sheet comprising a cell area corresponding to the at least one opening, and a dummy portion arranged outside the cell area;
   a pressing part configured to correspond to the dummy portion and press the dummy portion in a third direction intersecting a plane in which the first direction and the second direction extend; and
   a header configured to irradiate a laser beam toward the mask sheet to fix the mask sheet to the mask frame,
   wherein the pressing part is configured to bend the mask sheet such that the cell area is closer to the mask frame than an edge of the dummy portion.

2. The apparatus of claim 1, wherein the tensioning part comprises:
   at least one pair of grip parts configured to grip an edge of the dummy portion; and
   a moving part that moves the at least one pair of grip parts in the first direction or the second direction to apply a tensile force to the mask sheet.

3. The apparatus of claim 2, wherein the tensioning part further comprises a rotator that rotates the grip part around a rotation axis parallel to a surface of the mask frame.

4. The apparatus of claim 1, wherein the header is configured to check alignment between the mask sheet and the mask frame.

5. The apparatus of claim 1, wherein the header is configured to irradiate a laser beam to the mask sheet to cut a portion of the dummy portion from the cell area of the mask sheet.

6. The apparatus of claim 1, wherein the pressing part comprises at least two rollers to be placed in direct contact with the dummy portion.

7. The apparatus of claim 6, wherein the at least two rollers are arranged at opposite sides of an area corresponding to the cell area to sandwich the area between the at least two rollers.

8. The apparatus of claim 1, wherein the pressing part comprises an injection hole configured to spray compressed air to the dummy portion in the third direction.

9. The apparatus of claim 1, wherein the pressing part comprises a plurality of magnets arranged to apply a magnetic force in the third direction to the dummy portion.

10. The apparatus of claim 1, wherein the pressing part is configured to bend a portion of the mask sheet to be rounded.

11. A method of manufacturing a mask assembly, the method comprising:
    preparing a mask frame comprising at least one opening;
    preparing a mask sheet comprising a cell area corresponding to the at least one opening and a dummy portion arranged outside the cell area;
    tensioning the mask sheet;
    aligning the mask sheet to a side of the mask frame;
    pressing the dummy portion of the mask sheet toward the mask frame; and
    fixing the mask sheet to the mask frame by irradiating a laser beam to the dummy portion,
    wherein the pressing the dummy portion comprises bending a portion of the dummy portion relative to the cell area.

12. The method of claim 11, further comprising forming at least two pattern holes in the cell area of the mask sheet.

13. The method of claim 11, wherein the tensioning the mask sheet comprises gripping an edge of the dummy portion and applying a tensile force to the mask sheet in a first direction or a second direction.

14. The method of claim 11, wherein the pressing the dummy portion further comprises:
    pressing the mask sheet toward the mask frame by applying a force directly to the dummy portion;
    and
    bringing the dummy portion into contact with the mask frame.

15. The method of claim 11, wherein the pressing the dummy portion further comprises:
    pressing the dummy portion toward the mask frame by spraying compressed air to the dummy portion;
    and
    bringing the dummy portion into contact with the mask frame.

16. The method of claim 11, wherein the pressing the dummy portion further comprises:

pressing the dummy portion toward the mask frame by applying a magnetic force to the dummy portion; and bringing the dummy portion into contact with the mask frame.

17. The method of claim 11, wherein the bending the portion of the dummy portion comprises bending the portion of the dummy portion to be rounded.

18. The method of claim 11, further comprising cutting a portion of the dummy portion from the cell area of the mask sheet by irradiating a laser beam to the portion of the dummy portion.

19. A method of manufacturing a display device, the method comprising:

preparing a mask assembly;

placing and aligning a substrate and the mask assembly inside a chamber; and supplying a deposition material from a deposition source to the substrate through the mask assembly, wherein the preparing the mask assembly comprises:

tensioning a mask sheet comprising a cell area and a dummy portion arranged outside the cell area;

aligning the mask sheet above a mask frame comprising at least one opening;

pressing the dummy portion of the mask sheet toward the mask frame; and fixing the mask sheet to the mask frame by irradiating a laser beam to the dummy portion, wherein the pressing the dummy portion comprises bending a portion of the dummy portion relative to the cell area.

* * * * *